United States Patent
Bang et al.

(10) Patent No.: US 12,089,455 B2
(45) Date of Patent: Sep. 10, 2024

(54) DISPLAY DEVICE

(71) Applicant: Samsung Display Co., Ltd., Yongin-si (KR)

(72) Inventors: Hyunchol Bang, Yongin-si (KR); Wonkyu Kwak, Yongin-si (KR); Sunghwan Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 146 days.

(21) Appl. No.: 17/010,176

(22) Filed: Sep. 2, 2020

(65) Prior Publication Data

US 2021/0183983 A1   Jun. 17, 2021

(30) Foreign Application Priority Data

Dec. 17, 2019  (KR) .......................... 10-2019-0169181

(51) Int. Cl.
| | |
|---|---|
| *H10K 59/131* | (2023.01) |
| *H10K 59/122* | (2023.01) |
| *H10K 59/124* | (2023.01) |
| *H10K 59/126* | (2023.01) |
| *H10K 59/35* | (2023.01) |

(52) U.S. Cl.
CPC ......... *H10K 59/131* (2023.02); *H10K 59/122* (2023.02); *H10K 59/124* (2023.02); *H10K 59/126* (2023.02); *H10K 59/352* (2023.02)

(58) Field of Classification Search
CPC ............. H01L 27/3276; H01L 27/3272; H01L 27/3216; H01L 27/326; H01L 27/3246; H01L 27/3218; H10K 59/353; H10K 59/126; H10K 59/121; H10K 59/352; H10K 59/124; H10K 59/131; H10K 59/122

See application file for complete search history.

(56) References Cited

U.S. PATENT DOCUMENTS

| | | | |
|---|---|---|---|
| 8,169,579 B2 | 5/2012 | Kim | |
| 10,535,290 B2 | 1/2020 | Choi et al. | |
| 2017/0193876 A1* | 7/2017 | Choi | ...................... G09G 3/2003 |
| 2019/0081118 A1* | 3/2019 | Oh | ......................... H10K 50/844 |
| 2020/0133040 A1* | 4/2020 | Bang | ..................... G02F 1/1368 |
| 2021/0020732 A1* | 1/2021 | Watanabe | ................. G09F 9/30 |
| 2021/0391391 A1* | 12/2021 | Choi | ..................... G09G 3/3225 |
| 2021/0408146 A1* | 12/2021 | Ying | ..................... H10K 59/121 |

FOREIGN PATENT DOCUMENTS

| | | |
|---|---|---|
| KR | 10-1529957 | 6/2015 |
| KR | 10-1603224 | 3/2016 |
| KR | 10-2016-0066133 | 6/2016 |
| KR | 10-2017-0079923 | 7/2017 |

\* cited by examiner

*Primary Examiner* — Vongsavanh Sengdara
(74) *Attorney, Agent, or Firm* — KILE PARK REED & HOUTTEMAN PLLC

(57) ABSTRACT

A display device includes a first line group including first lines extending in a first direction on a substrate, a second line group including second lines extending in a second direction on the substrate, the second direction intersecting the first direction, a pixel circuit disposed at a region where the first line group intersects the second line group, a pixel overlapping the pixel circuit, a transmissive area surrounded by the first line group and the second line group, and a metal layer disposed between the substrate and the pixel circuit, the metal layer including an opening corresponding to the transmissive area.

20 Claims, 29 Drawing Sheets

DISPLAY DEVICE

CROSS-REFERENCE TO RELATED APPLICATIONS

This application claims priority to and the benefits of Korean Patent Application No. 10-2019-0169181 under 35 U.S.C. § 119, filed on Dec. 17, 2019, in the Korean Intellectual Property Office, the entire contents of which are incorporated herein by reference.

BACKGROUND

1. Technical Field

One or more embodiments relate to a display device.

2. Description of Related Art

Display devices have been applied to a broad range of uses in recent years. Additionally, since display devices are becoming thinner and more lightweight, such devices are being applied to a wide range of uses.

Accordingly, there may be various methods of designing shapes of the display devices, and functions or elements that may be applied or connected to the display devices are increasing.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments may include a display device including a first display area serving as a main display area and a second display area under or below which an optical device may be arranged or disposed. However, these aspects are examples, and the scope of the disclosure is not limited thereto.

Additional aspects will be set forth in part in the description which follows and, in part, will be apparent from the description, or may be learned by practice of the presented embodiments of the disclosure.

According to one or more embodiments, a display device may include a first line group including first lines extending in a first direction on a substrate, a second line group including second lines extending in a second direction on the substrate, the second direction intersecting the first direction, a pixel circuit disposed at a region where the first line group intersects the second line group, a pixel overlapping the pixel circuit, a transmissive area surrounded by the first line group and the second line group, and a metal layer disposed between the substrate and the pixel circuit and including an opening corresponding to the transmissive area.

The pixel may include a first sub-pixel overlapping the first line group around the pixel circuit, a second sub-pixel overlapping the second line group around the pixel circuit, and a third sub-pixel overlapping the pixel circuit.

The first sub-pixel and the third sub-pixel may be disposed adjacent to each other in a same row, and the second sub-pixel and the first sub-pixel may be disposed adjacent to each other in different rows.

A size of an emission area of the third sub-pixel may be greater than sizes of emission areas of the first sub-pixel and the second sub-pixel.

Portions of the first lines and the second lines may be bent and may extend in a third direction between the first direction and the second direction around the pixel circuit. Other portions of the first lines and the second lines may be bent and extend in a fourth direction around the pixel circuit. The fourth direction may be line symmetrical to the third direction.

The pixel may include a first sub-pixel overlapping the portions of the first lines and the second lines, which may extend in the third direction around the pixel circuit, a second sub-pixel overlapping the other portions of the first lines and the second lines, which may extend in the fourth direction around the pixel circuit, and a third sub-pixel overlapping the pixel circuit.

The first sub-pixel and the second sub-pixel may be disposed adjacent to each other in a same row, and the third sub-pixel and the first sub-pixel may be disposed adjacent to each other in different rows.

A size of the emission area of the third sub-pixel may be greater than sizes of emission areas of the first sub-pixel and the second sub-pixel.

The pixel may include a first sub-pixel overlapping the first line group and portions of the second line group around the pixel circuit, a second sub-pixel overlapping the first line group and others of the second line group around the pixel circuit, and a third sub-pixel overlapping the pixel circuit.

The first sub-pixel and the second sub-pixel may be disposed adjacent to each other in a same row, and the third sub-pixel and the first sub-pixel may be disposed adjacent to each other in different rows.

A size of an emission area of the third sub-pixel may be greater than sizes of emission areas of the first sub-pixel and the second sub-pixel.

The pixel may comprise first to third sub-pixels overlapping the pixel circuit and disposed adjacent to each other in the first direction. The first sub-pixel and the third sub-pixel may partially overlap the first line group around the pixel circuit.

A size of an emission area of the third sub-pixel in the second direction may be greater than sizes of emission areas of the first sub-pixel and the second sub-pixel in the second direction.

The pixel may include sub-pixels. Each of the sub-pixels may include a pixel electrode and an emission layer. An opposite electrode may be disposed in each of the sub-pixels and disposed on the emission layer. The opposite electrode may include an opening corresponding to the transmissive area.

The display device may further include a planarization layer disposed between the pixel circuit and the sub-pixels, and a pixel defining layer disposed between the pixel electrode and the opposite electrode. The planarization layer may include holes overlapping the pixel electrodes of the sub-pixels. The pixel defining layer may overlap the holes of the planarization layer.

The display device may further include a planarization layer disposed between the pixel circuit and the sub-pixels, the planarization layer including holes that may overlap the pixel electrodes of the plurality of sub-pixels, and a pixel defining layer disposed between the pixel electrode and the opposite electrode. The holes of the planarization layer may include holes that may overlap the pixel defining layer, and holes that may overlap the emission layer.

The display device may further include an inorganic insulating layer disposed on the substrate. The inorganic insulating layer may include an opening corresponding to the transmissive area.

According to one or more embodiments, a display device may include a substrate including a first display area and a second display area, a first line group including first lines extending in a first direction in the first display area and the second display area, a second line group including second lines extending in a second direction in the first display area and the second display area, the second direction intersecting the first direction, a first pixel circuit disposed at a region where the first line group intersects the second line group in the first display area, a first pixel electrode overlapping the first pixel circuit, a second pixel circuit disposed at a region where the first line group intersects the second line group in the second display area, and a second pixel electrode overlapping the second pixel circuit. The second display area may comprise a transmissive area surrounded by the first line group and the second line group. A number of the first lines and the second lines in the second display area may be less than a number of the first lines and the second lines in the first display area.

The display device may further include a metal layer disposed between the substrate and the second pixel circuit in the second display area. The metal layer may include an opening corresponding to the transmissive area.

An opposite electrode may be disposed in the first display area and the second display area. The opposite electrode may overlap the first line group, the second line group, the first pixel electrode, and the second pixel electrode.

The opposite electrode may include an opening corresponding to the transmissive area in the second display area.

The first lines of the first line group and the second lines of the second line group may extend in a third direction around the second pixel circuit in the second display area. The third direction may be a direction between the first direction and the second direction.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
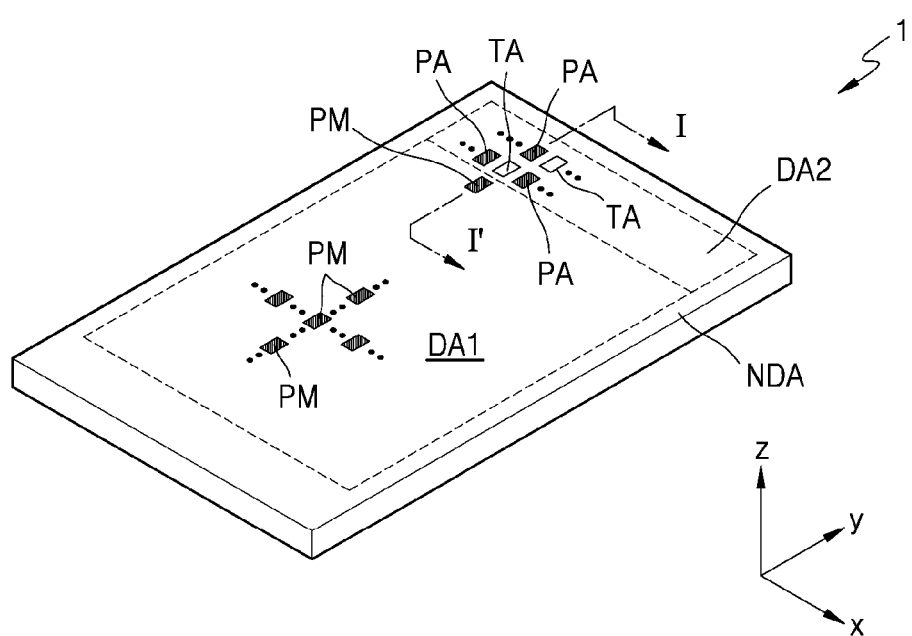
FIG. 1 is a schematic perspective view of a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc. may be used herein to describe various elements, these elements should not be limited by these terms. These terms are only used to distinguish one element from another. For instance, a first element discussed below could be termed a second element without departing from the teachings of the disclosure. Similarly, the second element could also be termed the first element.

As used herein, the singular forms "a", "an" and "the" are intended to include the plural forms as well, unless the context clearly indicates otherwise.

It will be further understood that when the terms "comprises," "comprising," "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

When some embodiments may be embodied otherwise, specific process operations described herein may be performed otherwise. For example, two process operations described in a sequential order may be performed substantially at the same time or in reverse order.

It will be understood that when a layer, region, or element is referred to as being "connected to" or "coupled to" another layer, region, or element, it can be directly connected or coupled to the other layer, region, or element or intervening layers, regions, or elements may be present. For example, as used herein, when a layer, region, or element is referred to as being "electrically connected to" another layer, region, or element, it can be directly electrically connected to the other layer, region, or element or intervening layers, intervening regions, or intervening elements may be present.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic perspective view of a display device 1 according to an embodiment.

Referring to FIG. 1, the display device 1 may include a first display area DA1 and a second display area DA2, which may display images, and a non-display area NDA, which may not display images. In the following embodiments, the term "pixel" denotes a unit pixel including at least two sub-pixels, and the term "sub-pixel" may include an organic light-emitting diode serving as a display element.

The display device 1 may provide or display a main image or images using light emitted by first pixels PM in the first display area DA1. The first pixel PM may be a unit pixel including sub-pixels (refer to Pm in FIG. 2).

The display device 1 may include the second display area DA2. The second display area DA2 may be a region under or below which a component, such as a sensor using infrared (IR) light, visible light, or sound, or a camera (or an image sensor), may be arranged or disposed. The camera may include any image capturing device within the spirit and the scope of the disclosure. The second display area DA2 may include a transmissive area TA that may transmit light and/or sound that may be output by the component to the outside or that may travel from the outside toward the component. In an embodiment, when IR light is transmitted through the second display area DA2, a light transmittance of the second display area DA2 may be about 30% or higher, about 50% or higher, about 75% or higher, about 80% or higher, about 85% or higher, or about 90% or higher.

Second pixels PA may be arranged or disposed in the second display area DA2, and the second display area DA2 may provide or display a predetermined image or images using light emitted by the second pixels PA. The image or images provided or displayed by the second display area DA2 may be an auxiliary image or images. In an embodiment, a resolution of the second display area DA2 may be about equal to a resolution of the first display area DA1. In an embodiment, the resolution of the second display area DA2 may be lower than the resolution of the first display area DA1. Since the second display area DA2 may include the transmissive area TA that may transmit light and/or sound, the number of second pixels PA that may be arranged or disposed per unit area may be less than the number of first pixels PM that may be arranged or disposed per unit area in the first display area DA1. The second pixel PA may be a unit pixel including sub-pixels (refer to Pa in FIG. 2).

The second display area DA2 may be located or disposed on a side of the first display area DA1. FIG. 1 illustrates an embodiment in which the second display area DA2 may be arranged or disposed above the first display area DA1, and the second display area DA2 may be arranged or disposed between the non-display area NDA and the first display area DA1.

Hereinafter, an organic light-emitting display apparatus will be described as an example of the display device 1 according to an embodiment, however, a display device according to the disclosure is not limited thereto. In an embodiment, various kinds of display devices, such as, for example, an inorganic light-emitting display apparatus and/or a quantum dot light-emitting display apparatus, may be employed.

Although FIG. 1 illustrates an example in which the second display area DA2 may be arranged or disposed above the first display area DA1, which may have a substantially rectangular shape, the disclosure is not limited thereto. The first display area DA1 may have a substantially circular shape, a substantially elliptical shape, or a substantially polygonal shape (for example, a substantially triangular shape or a substantially pentagonal shape), and the positions and the number of second display areas DA2 may be variously changed within the spirt and the scope of the disclosure.

Figure 2:
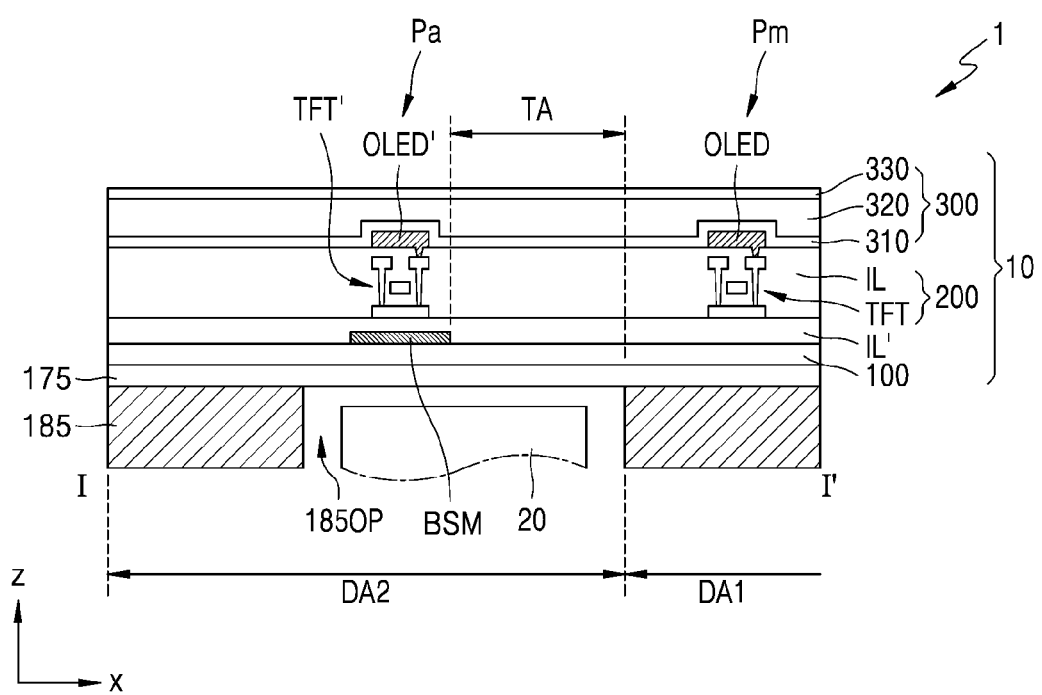
FIG. 2 is a schematic cross-sectional view of a display device according to embodiments.

FIG. 2 is a schematic cross-sectional view of a display device 1 according to an embodiment, which corresponds to a cross-section taken along a line I-I' of FIG. 1.

Referring to FIG. 2, the display device 1 may include a display panel 10 including a display element and/or a component 20 arranged or disposed to correspond to a second display area DA2.

The display panel 10 may include a substrate 100, a display element layer 200 arranged or disposed on the substrate 100, and a thin-film encapsulation layer 300 that may serve as a sealing member that may seal the display element layer 200. The display panel 10 may include a lower protective film or layer 175 and a lower cover layer 185 under or below the substrate 100.

The display element layer 200 may include a circuit layer including thin-film transistors TFT and TFT', organic light-emitting diodes OLED and OLED' that may serve as display elements, and insulating layers IL and IL' therebetween.

A sub-pixel Pm including the organic light-emitting diode OLED may be arranged or disposed in a first display area DA1. The sub-pixel Pm may be electrically connected to a pixel circuit including the thin-film transistor TFT.

A sub-pixel Pa including the organic light-emitting diode OLED' may be arranged or disposed in the second display area DA2. The sub-pixel Pa may be electrically connected to a pixel circuit including the thin-film transistor TFT'.

A transmissive area TA in which the thin-film transistor TFT' and the sub-pixel Pa may not be arranged may be arranged or disposed in the second display area DA2. The transmissive area TA may be a region through which light (or a signal) emitted by the component 20 or light (or a signal) incident to the component 20 may be transmitted.

The component 20 may be arranged or disposed in the second display area DA2. The component 20 may be an electronic element using light or sound. For example, the component 20 may be a sensor (for example, an infrared (IR) sensor) that may receive and use light, a sensor that may output and detect light or sound and measure a distance or recognize a fingerprint, a small lamp that may output light, a speaker that may output sound, and/or an image sensor that may capture an image or images. When the component 20 is an electronic element using light, light having various wavelength bands, such as visible light, IR light, and ultraviolet (UV) light, may be used within the spirit and the scope of the disclosure. The component 20 arranged or disposed in the second display area DA2 may be provided or disposed in plural. For example, a light-emitting device and a light-receiving device may be provided or disposed together as the component 20 in one second display area DA2. Alternatively, one component 20 may include both a light-emitting unit and a light-receiving unit. However, the disclosure is not limited thereto and the component 20 may include any combination of electronic elements within the spirit and the scope of the disclosure.

A lower metal layer BSM may be arranged or disposed in the second display area DA2. The lower metal layer BSM may be arranged or disposed under or below the thin-film transistor TFT' to substantially correspond to the thin-film transistor TFT'. The lower metal layer BSM may be a light blocking layer that may block external light from reaching the second pixel PA including the thin-film transistor TFT'. For example, the lower metal layer BSM may block light emitted by the component 20 from reaching the second pixel PA. In an embodiment, a constant voltage or a signal may be applied to the lower metal layer BSM, and thus, damage to the pixel circuit due to electrostatic discharge may be prevented.

The thin-film encapsulation layer 300 may include at least one inorganic encapsulation layer and at least one organic encapsulation layer. FIG. 2 illustrates first and second inorganic encapsulation layers 310 and 330 and an organic encapsulation layer 320 therebetween.

The first and second inorganic encapsulation layers 310 and 330 may include at least one inorganic insulating material, such as aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acrylic resin, an epoxy resin, polyimide, and polyethylene. However, the materials are not limited thereto.

The lower protective film 175 may be adhered to a bottom surface of the substrate 100 and support and protect the substrate 100. The lower protective film 175 may include a material having a high transmittance with respect to light. The lower protective film 175 may include polyethylene terephthalate (PET) or polyimide (PI).

The lower cover layer 185 may be arranged or disposed under or below the lower protective film 175. The lower cover layer 185 may include an opening 185OP corresponding to the second display area DA2. Since the lower cover layer 185 includes the opening 185OP, a light transmittance of the second display area DA2 may be increased. The lower cover layer 185 may include a light-blocking material. Thus, the lower cover layer 185 may block external light that may be transmitted through a lower surface of the substrate 100.

An area of the second display area DA2 may be larger than an area occupied by the component 20. Thus, an area of the opening 185OP in the lower cover layer 185 may not be equal to the area of the second display area DA2. For example, the area of the opening 185OP may be less than the area of the second display area DA2.

Components 20 may be arranged or disposed in the second display area DA2. The components 20 may serve different functions.

Although not shown, other components, such as an input sensing member that may sense a touch input, an anti-reflection member including a polarizer and/or a retarder or a color filter and/or a black matrix, and/or a transparent window, may be arranged or disposed on the display panel 10.

Although an embodiment illustrates a case in which the thin-film encapsulation layer 300 may be used as an encapsulation member that may seal the display element layer 200, the disclosure is not limited thereto. For example, a sealing substrate, which may be bonded to the substrate 100 by a sealant or frit, may be used as a member that may seal the display element layer 200.

Figure 3:
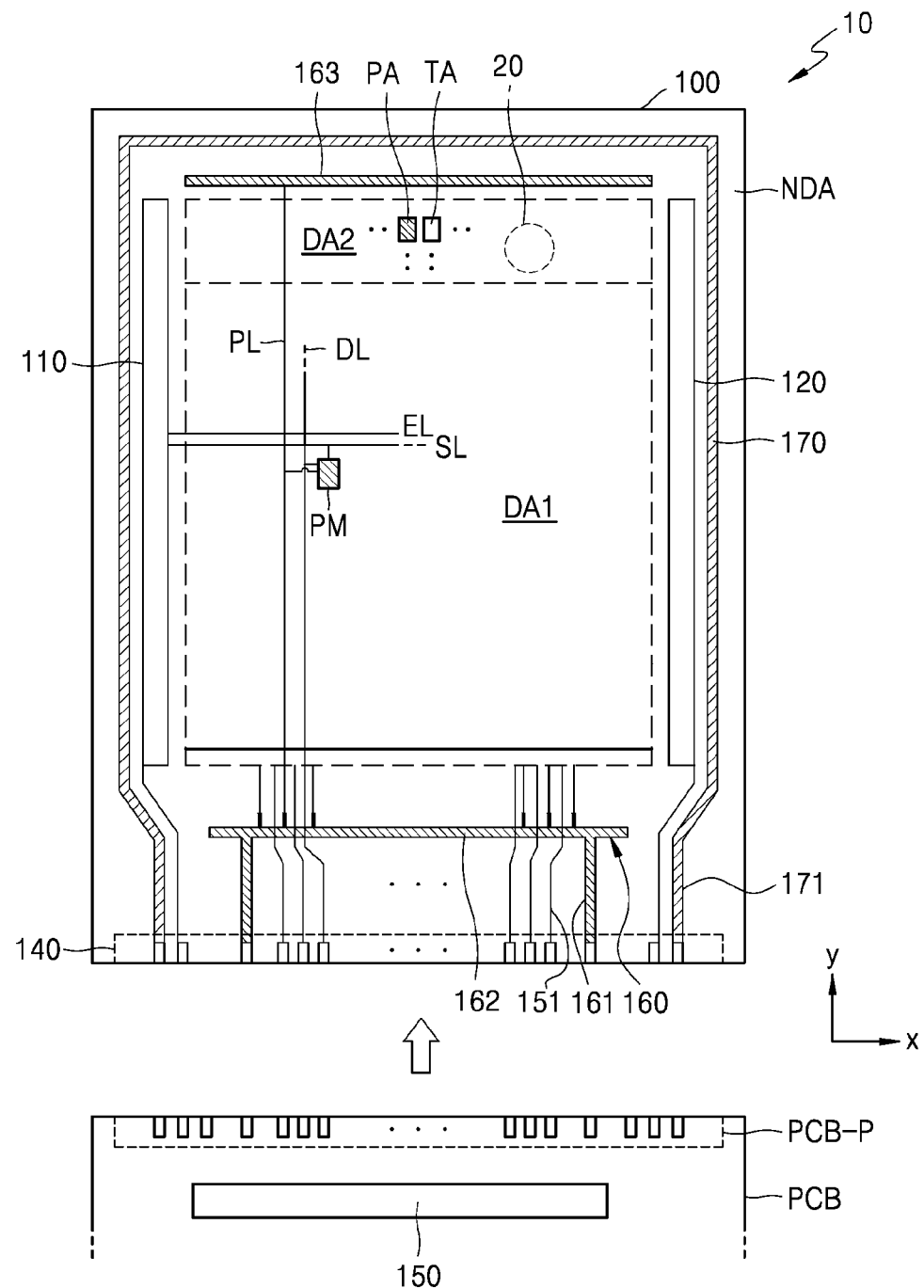
FIG. 3 is a schematic plan view of a display panel according to an embodiment.

FIG. 3 is a schematic plan view of a display panel 10 according to an embodiment.

Referring to FIG. 3, the display panel 10 may include a substrate 100. First pixels PM may be arranged or disposed on a first display area DA1 of the substrate 100. The first pixel PM may include sub-pixels (refer to Pm in FIG. 2), each of which may include a display element, such as an organic light-emitting diode (refer to OLED in FIG. 2). The sub-pixels Pm may emit, for example, red, green, blue, or white light from the organic light-emitting diode.

A second display area DA2 may be arranged or disposed on a side of the first display area DA1. Second pixels PA may be arranged or disposed on the second display area DA2 of the substrate 100. The second pixel PA may include sub-pixels (refer to Pa in FIG. 2), each of which may include a display element, such as an organic light-emitting diode (refer to OLED' in FIG. 2). The sub-pixels Pa may emit, for example, red, green, blue, or white light from the organic light-emitting diode. A transmissive area TA may be arranged or disposed between the second pixels PA in the second display area DA2. At least one component 20 may be arranged or disposed under or below the second display area DA2 of the substrate 100.

In an embodiment, the second display area DA2 may include the transmissive area TA, and thus, a resolution of the second display area DA2 may be lower than a resolution of the first display area DA1. For example, the resolution of the second display area DA2 may be about ½ of the resolution of the first display area DA1. In an embodiment, the resolution of the first display area DA1 may be about 400 ppi or more, and the resolution of the second display area DA2 may be about 200 ppi. In an embodiment, the arrangement of a pixel circuit that may drive the second pixel PA of the second display area DA2 and lines that may transmit signals to the pixel circuit of the second pixel PA may be changed to be different from the arrangement of a pixel circuit that may drive the first pixel PM and lines that may transmit signals to the pixel circuit of the first pixel PM. Thus, the second display area DA2 may include the transmissive area TA and may have the same resolution as the first display area DA1.

The first pixel PM and the second pixel PA may be electrically connected to driver circuits arranged or disposed in a non-display area NDA. A first scan driver circuit 110, a second scan driver circuit 120, a terminal 140, a data driver circuit 150, a first power supply line 160, and a second power supply line 170 may be arranged or disposed in the non-display area NDA.

The first scan driver circuit 110 may provide scan signals to the first pixel PM and the second pixel PA through a scan line SL. The first scan driver circuit 110 may provide an emission control signal to each pixel through an emission control line EL. The second scan driver circuit 120 may be arranged or disposed parallel with the first scan driver circuit 110 with the first display area DA1 therebetween. Some of the first pixels PM and the second pixels PA arranged or disposed in the first display area DA1 and the second display area DA2, respectively, may be electrically connected to the first scan driver circuit 110, and the others thereof may be electrically connected to the second scan driver circuit 120. In an embodiment, the second scan driver circuit 120 may be omitted.

The terminal 140 may be arranged or disposed at a side of the substrate 100. The terminal 140 may not be covered or overlapped by an insulating layer but may be exposed and electrically connected to a printed circuit board PCB. A terminal PCB-P of the printed circuit board PCB may be electrically connected to the terminal 140 of the display panel 10. The printed circuit board PCB may transmit a signal of a controller (not shown) or power to the display panel 10. A control signal generated by the controller may be transmitted through the printed circuit board PCB to each of the first and second scan driver circuits 110 and 120. The controller may provide first and second power supply voltages (refer to ELVDD and ELVSS in FIGS. 4A and 4B) to the first and second power supply lines 160 and 170 through first and second connection lines 161 and 171, respectively. The first power supply voltage ELVDD may be provided to each of the first pixels PM and the second pixels PA through a power supply voltage line PL electrically connected to the first power supply line 160. The second power supply voltage ELVSS may be provided to an opposite electrode of each of the first pixels PM and the second pixels PA electrically connected to the second power supply line 170.

The data driver circuit 150 may be electrically connected to data lines DL. The data driver circuit 150 may provide data signals to the first pixels PM and the second pixels PA through connection lines 151 electrically connected to the terminal 140 and the data lines DL electrically connected to the connection lines 151. Although FIG. 3 illustrates an example in which the data driver circuit 150 may be arranged or disposed on the printed circuit board PCB, in an embodiment, the data driver circuit 150 may be arranged or disposed on the substrate 100. For example, the data driver circuit 150 may be arranged or disposed between the terminal 140 and the first power supply line 160.

The first power supply line 160 may include a first sub-line 162 and a second sub-line 163, which may extend in parallel in an x direction with the first display area DA1 therebetween. The second power supply line 170 may have a substantially loop shape of which one side portion may be open, and may partially surround the first display area DA1.

Figure 4A:
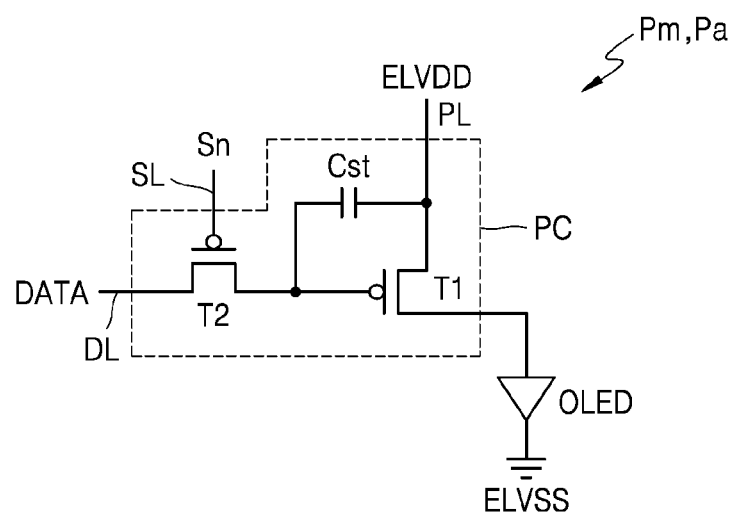
FIGS. 4A and 4B are equivalent circuit diagrams of sub-pixels of a first pixel and/or a second pixel that may be included in a display panel according to an embodiment.
Figure 4B:
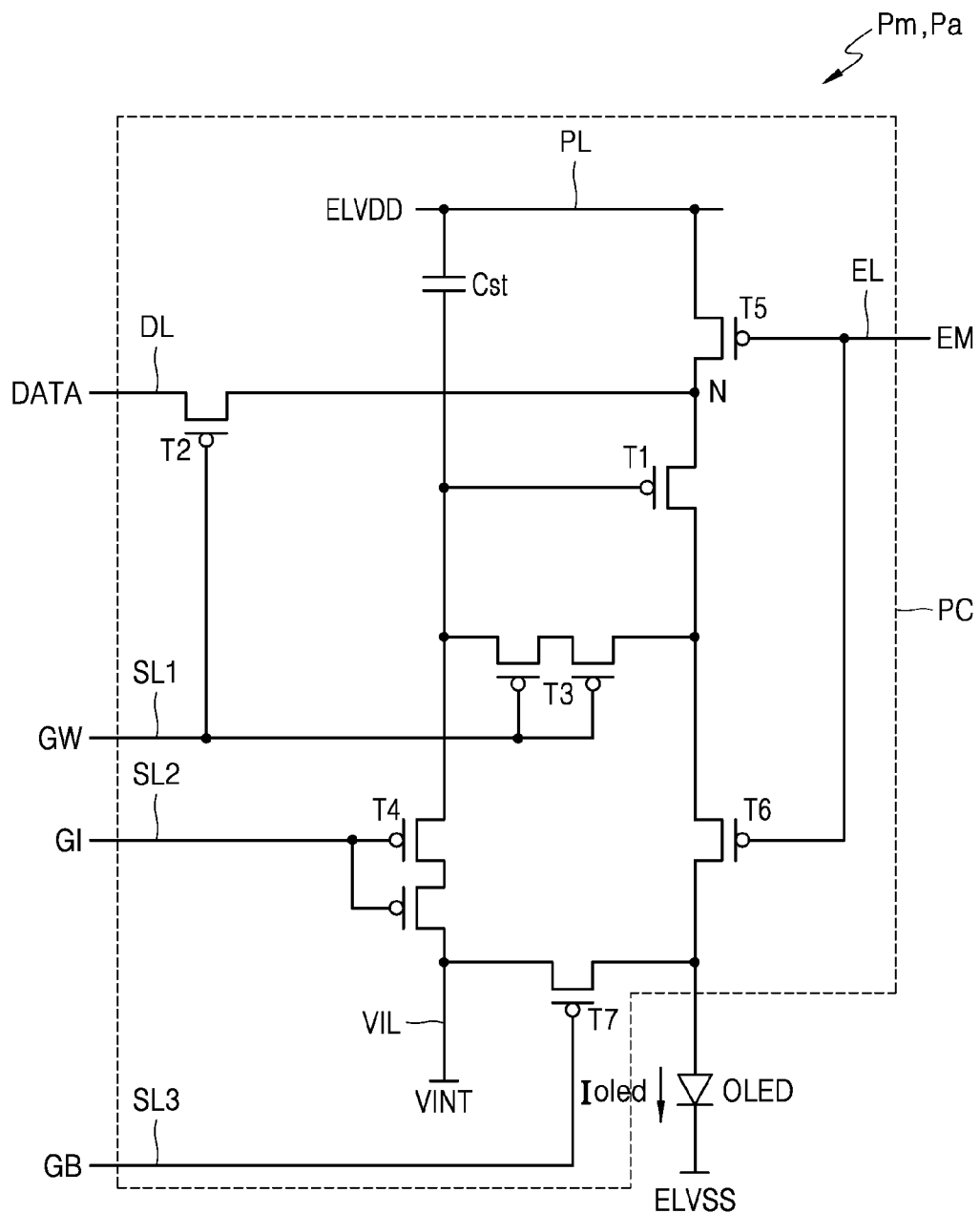

FIGS. 4A and 4B are equivalent circuit diagrams of sub-pixels of a first pixel and/or a second pixel that may be included in a display panel according to an embodiment.

Referring to FIG. 4A, each of sub-pixels Pm and Pa may include an organic light-emitting diode OLED. The organic light-emitting diode OLED may be electrically connected to a pixel circuit PC, which may be electrically connected to a scan line SL and a data line DL. The pixel circuit PC may include a first transistor T1, a second transistor T2, and a capacitor Cst. Each of the first transistor T1 and the second transistor T2 may include a thin-film transistor.

The second transistor T2, which may be a switching transistor, may be electrically connected to the scan line SL and the data line DL. The second transistor T2 may receive a data signal DATA through the data line DL and transmit the data signal DATA to the first transistor T1 in response to a scan signal Sn received through the scan line SL.

The capacitor Cst may be electrically connected to the second transistor T2 and a power supply voltage line PL and store a voltage corresponding to a difference between a voltage received from the second transistor T2 and a first power supply voltage ELVDD (or a driving voltage) supplied to the power supply voltage line PL.

The first transistor T1, which may be a driver or driving transistor, may be electrically connected to the power supply voltage line PL and the capacitor Cst and control a driving current flowing from the power supply voltage line PL to the organic light emitting diode OLED based on the voltage stored in the capacitor Cst. The organic light-emitting diode OLED may emit light having a predetermined luminance according to the driving current. An opposite electrode (for example, a cathode) of the organic light-emitting diode OLED may receive a second power supply voltage ELVSS.

Although FIG. 4A illustrates a case in which the pixel circuit PC may include two transistors and one capacitor, the disclosure is not limited thereto. As shown in FIG. 4B, the pixel circuit PC may include seven transistors and one capacitor.

Referring to FIG. 4B, the pixel circuit PC may include first to seventh transistors T1 to T7, each of which may include a thin-film transistor.

The pixel circuit PC may be electrically connected to a first scan line SL1 that may transmit a first scan signal GW, a second scan line SL2 that may transmit a second scan signal GI, a third scan line SL3 that may transmit a third scan signal GB, an emission control line EL that may transmit an emission control signal EM, and the data line DL that may transmit the data signal DATA.

The power supply voltage line PL may transmit the first power supply voltage ELVDD to the first transistor T1. An initialization voltage line VIL may transmit an initialization voltage VINT that may initialize the first transistor T1 and the organic light-emitting diode OLED to a gate electrode of the first transistor T1 and the organic light-emitting diode OLED.

The first scan line SL1, the second scan line SL2, the third scan line SL3, the emission control line EL, and an initialization voltage line VIL may extend in an x direction and be arranged or disposed apart from each other in each row. The data line DL and the power supply voltage line PL may extend in the y direction and be arranged or disposed apart from each other in each column.

The first transistor T1 may be electrically connected to the power supply voltage line PL via the fifth transistor T5 and electrically connected to the organic light-emitting diode OLED via the sixth transistor T6. The first transistor T1, which may be a driver or driving transistor, may receive the data signal DATA due to a switching operation of the second transistor T2 and supply a driving current Ioled to the organic light-emitting diode OLED.

The second transistor T2 may be electrically connected to the first scan line SL1 and the data line DL and may be turned on in response to the first scan signal GW received through the first scan line SL1 and may perform a switching operation of transmitting the data signal DATA transmitted to the data line DL, to a node N.

The third transistor T3 may be electrically connected to the organic light-emitting diode OLED via the sixth transistor T6. The third transistor T3 may be turned on in response to the first scan signal GW received through the first scan line SL1 and may diode-connect the first transistor T1.

The fourth transistor T4 may be turned on in response to the second scan signal GI received through the second scan line SL2 and may transmit the initialization voltage VINT from the initialization voltage line VIL to the gate electrode of the first transistor T1 and initialize a gate voltage of the first transistor T1.

The fifth transistor T5 and the sixth transistor T6 may be simultaneously turned on in response to the emission control signal EM received through the emission control line EL and may form a current path through which the driving current Ioled may flow from the power supply voltage line PL toward the organic light-emitting diode OLED.

The seventh transistor T7 may be turned on in response to the third scan signal GB received through the third scan line SL3 and may transmit the initialization voltage VINT from the initialization voltage line VIL to the organic light-emitting diode OLED and initialize the organic light-emitting diode OLED. The seventh transistor T7 may be omitted.

The capacitor Cst may be electrically connected to the power supply voltage line PL and the gate electrode of the first transistor T1 and store and maintain a voltage corresponding to a voltage difference between both ends thereof to maintain a voltage applied to the gate electrode of the first transistor T1.

The organic light-emitting diode OLED may include a pixel electrode and the opposite electrode, and the opposite electrode may receive the second power supply voltage ELVSS. The organic light-emitting diode OLED may receive the driving current Ioled from the first transistor T1 and emit light to display an image or images.

Although FIG. 4B illustrates a case in which each of the third transistor T3 and the fourth transistor T4 may include a dual gate electrode, each of the third transistor T3 and the fourth transistor T4 may include one gate electrode.

In an embodiment, the sub-pixel Pm of the first pixel (PM) and the sub-pixel Pa of the second pixel (PA) may include the same pixel circuit PC. However, the disclosure is not limited thereto. The sub-pixel Pm of the first pixel PM and the sub-pixel Pa of the second pixel PA may include pixel circuits PC having different structures. The pixel circuit PC of the sub-pixel Pm of the first pixel PM and the pixel circuit PC of the sub-pixel Pa of the second pixel PA may be variously modified, for instance, the sub-pixel Pm of the first pixel PM may adopt the pixel circuit of or similar to FIG. 4B, while the sub-pixel Pa of the second pixel PA may adopt the pixel circuit of or similar to FIG. 4A.

Figure 5A:
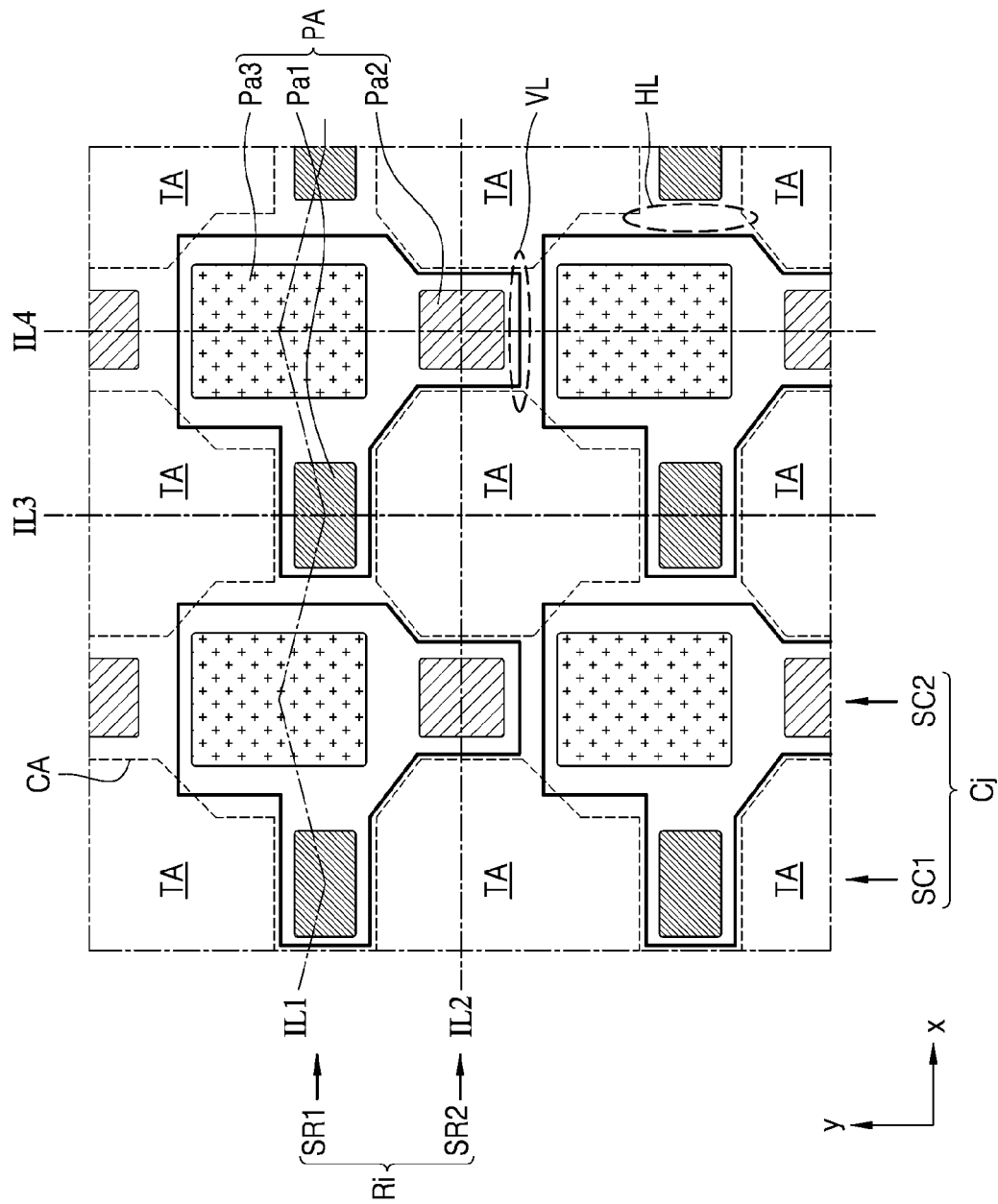
FIG. 5A is a schematic plan view showing the arrangement of pixels in a second display area according to an embodiment.
Figure 5B:
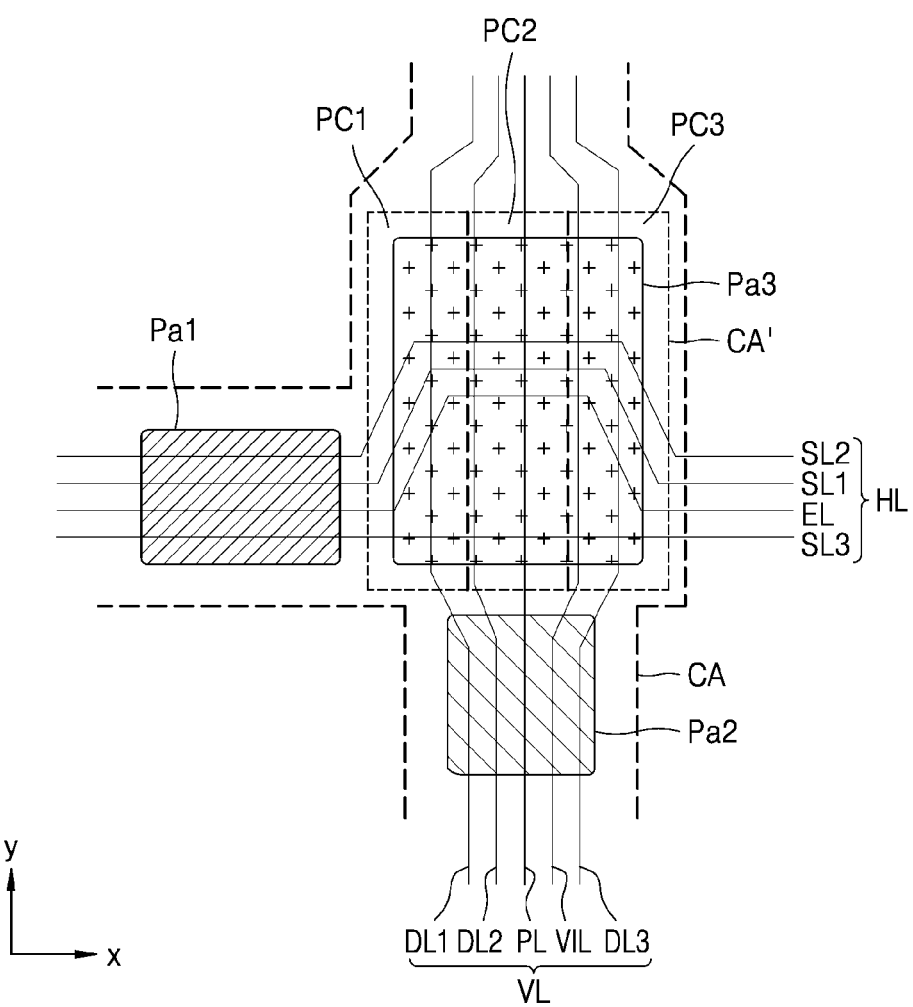
FIG. 5B is an enlarged view of a second pixel of FIG. 5A.
Figure 6:
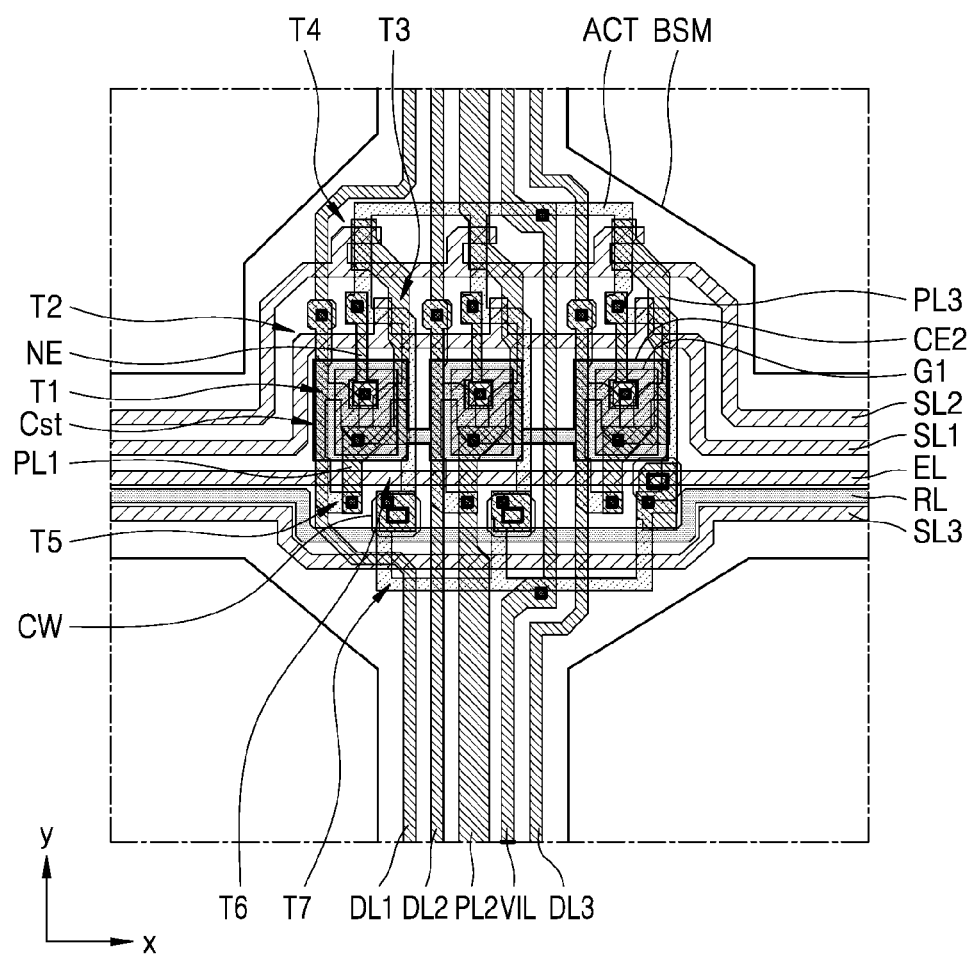
FIGS. 6 and 7 are schematic layout diagrams showing positions of pixel circuits, lines, and sub-pixels of the second pixel shown in FIG. 5A.
Figure 7:
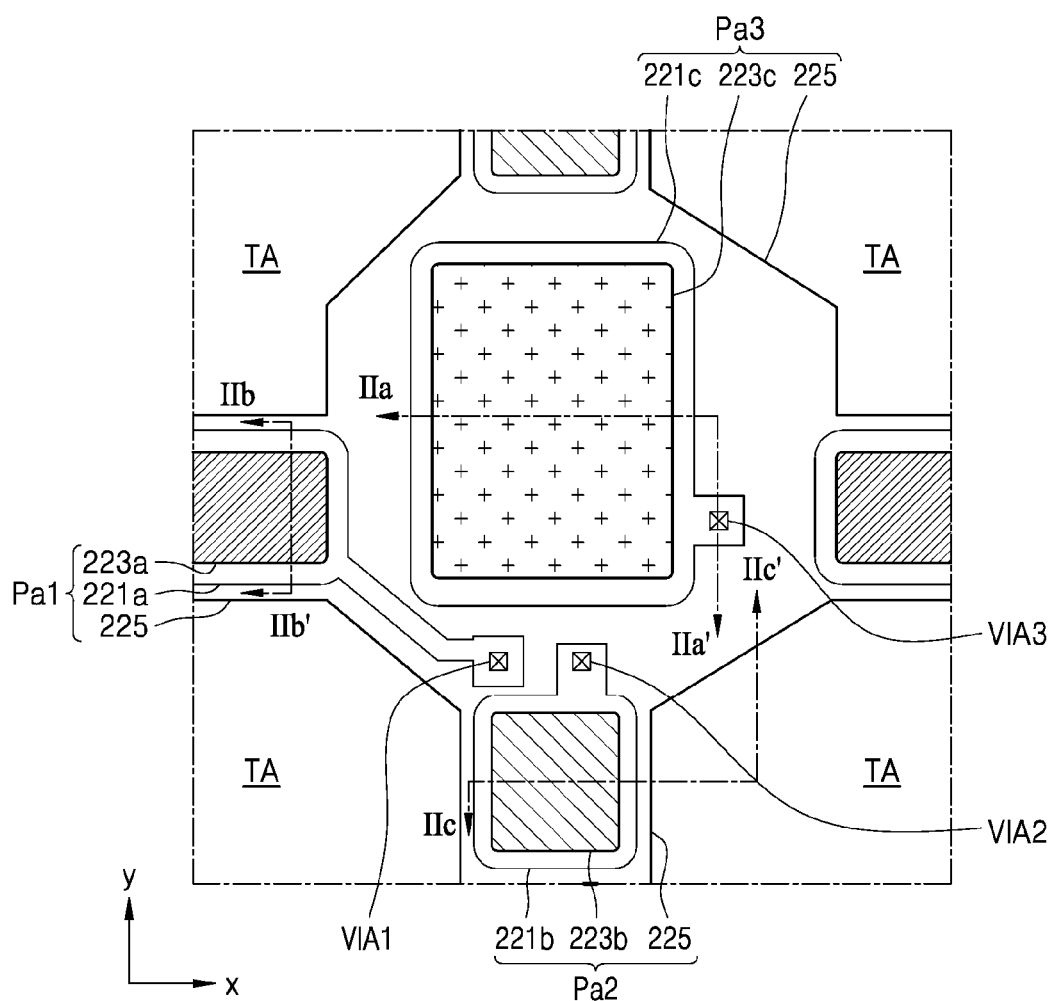
Figure 8:
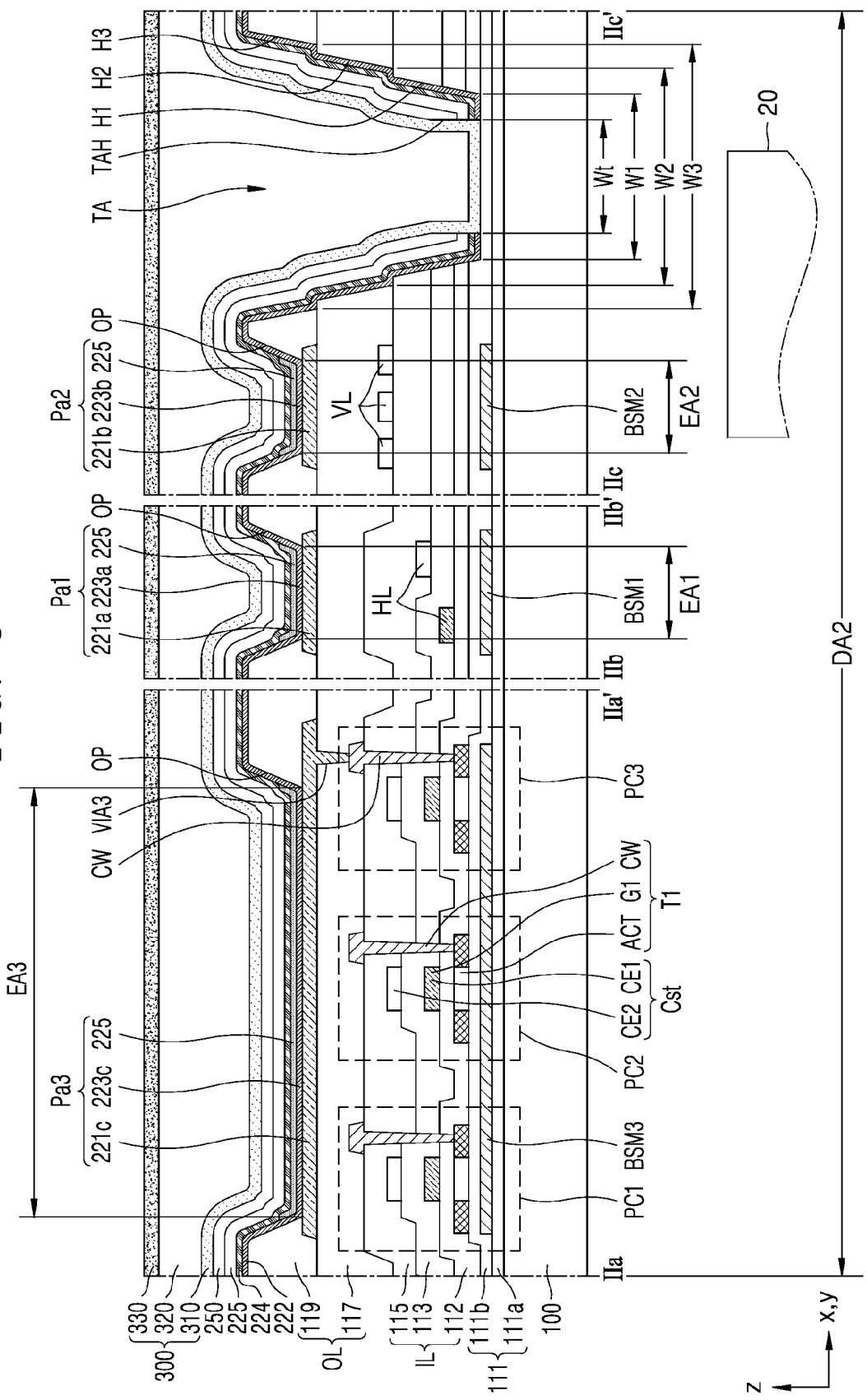
FIGS. 8 to 10 are schematic cross-sectional views of the second pixel, which are taken along lines IIa-IIa', IIb-IIb', and IIc-IIc' of FIG. 7.
Figure 9:
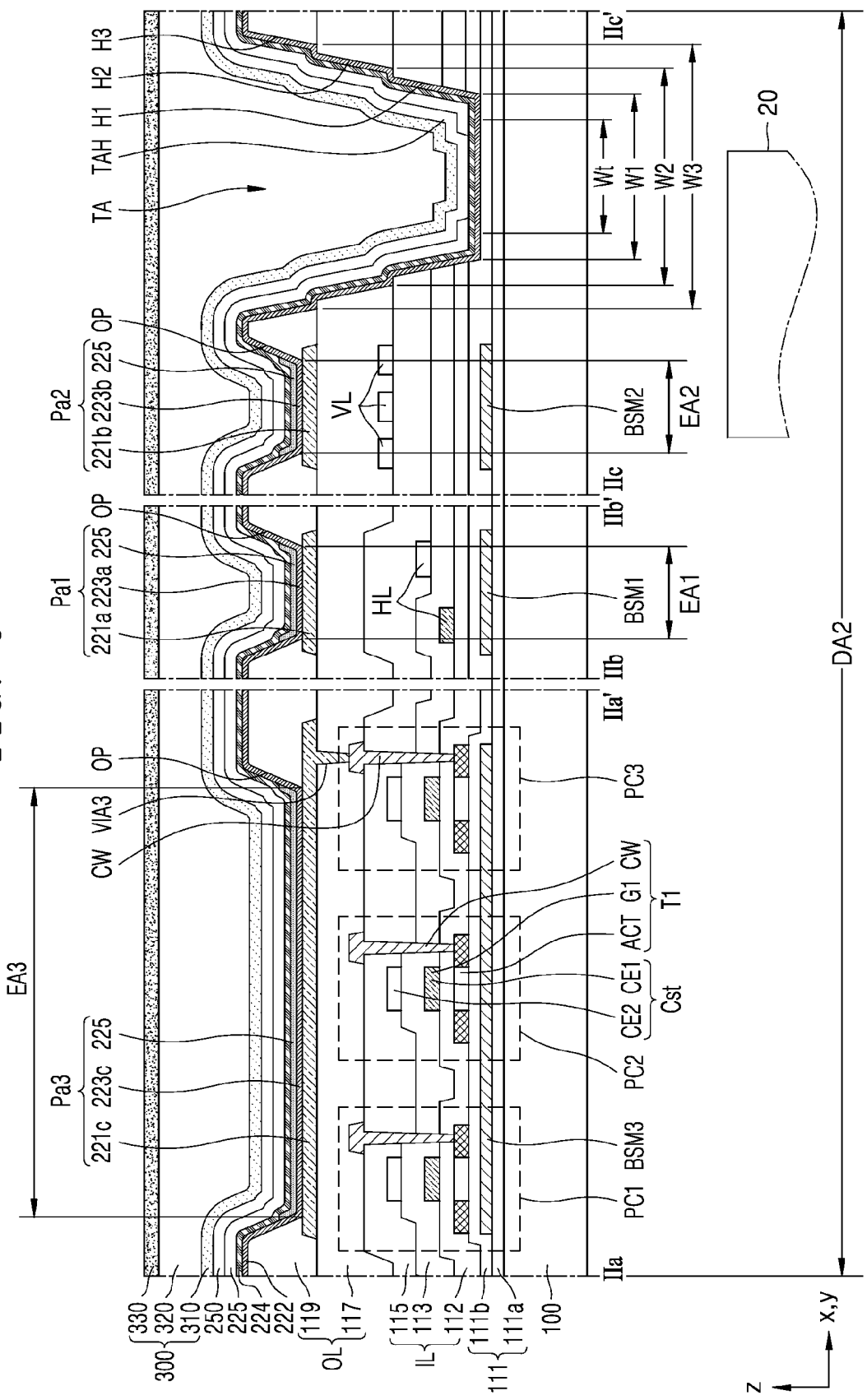
Figure 10:
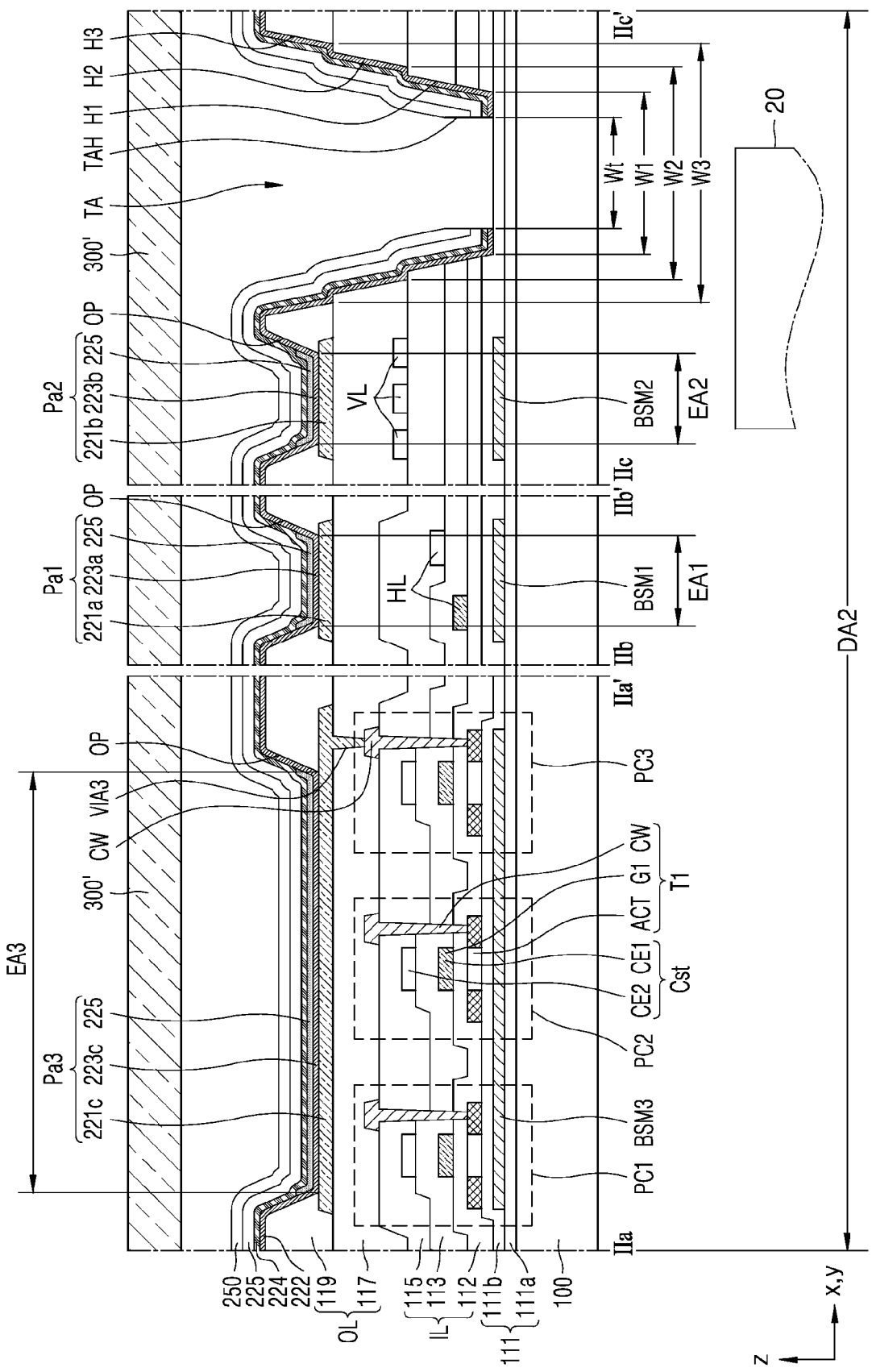

FIG. 5A is a schematic plan view showing an arrangement of pixels in a second display area DA2 according to an embodiment. FIG. 5B is an enlarged view of a second pixel PA of FIG. 5A. FIGS. 6 and 7 are schematic layout diagrams showing positions of pixel circuits, lines, and sub-pixels of the second pixel PA shown in FIG. 5A. FIGS. 8 to 10 are schematic cross-sectional views of the second pixel PA, which are taken along lines IIa-IIa', IIb-IIb', and IIc-IIc' of FIG. 7.

Referring to FIG. 5A, the second display area DA2 of a display device may include a non-transmissive area CA and a transmissive area TA surrounded by the non-transmissive area CA.

The second pixel PA may be repetitively arranged or disposed in an ±x direction (row direction) and a ±y direction (column direction) in the non-transmissive area CA. The second pixel PA may include sub-pixels. The second pixel PA may include a first sub-pixel Pa1, a second sub-pixel Pa2, and a third sub-pixel Pa3. Since one third sub-pixel Pa3 may be provided or disposed to correspond to one first sub-pixel Pa1 and one second sub-pixel Pa2, a size of the third sub-pixel Pa3 may be greater than sizes of the first sub-pixel Pa1 and the second sub-pixel Pa2. The first sub-pixel Pa1, the second sub-pixel Pa2, and the third sub-pixel Pa3 may respectively render different colors. For example, the first sub-pixel Pa1, the second sub-pixel Pa2, and the third pixel Pa3 may render red, green, and blue colors, respectively.

In a first sub-row SR1 of each row Ri, the first sub-pixel Pa1 and the third sub-pixel Pa3 may be alternately arranged or disposed in an ±x direction along an imaginary first line IL1 connecting a center of the first sub-pixel Pa1 to a center of the third sub-pixel Pa3. In a second sub-row SR2 of each row Ri, the second sub-pixel Pa2 may be repetitively arranged or disposed in the ±x direction along an imaginary second line IL2 connecting a center of the second sub-pixel Pa2. The first line IL1 may extend substantially straight or substantially in a zigzag. The second line IL2 may extend substantially straight or substantially in a zigzag and may not intersect with the first line IL1.

In a first sub-column SC1 of each column Cj, the first sub-pixel Pa1 may be repetitively arranged or disposed in the ±y direction along an imaginary third line IL3 connecting a center of the first sub-pixel Pa1. In a second sub-column SC2 of each column Cj, the second sub-pixel Pa2 and the third sub-pixel Pa3 may be alternately arranged or disposed in the ±y direction along an imaginary fourth line IL4 connecting the center of the second sub-pixel Pa2 and a center of the third sub-pixel Pa3. The third line IL3 may extend substantially straight or substantially in a zigzag. The fourth line IL4 may extend substantially straight or substantially in a zigzag and may not intersect with the third line IL3.

As shown in FIGS. 5A and 5B, in the non-transmissive area CA, a first line group HL including first lines extending in the ±x direction may be arranged or disposed in each row Ri, and a second line group VL including second lines extending in the ±y direction may be arranged or disposed in each column Cj.

The first lines may include a first scan line SL1, a second scan line SL2, a third scan line SL3, and an emission control line EL. The second lines may include a first data line DL1 electrically connected to a first pixel circuit PC1, a second data line DL2 electrically connected to a second pixel circuit PC2, a third data line DL3 electrically connected to a third pixel circuit PC3, a power supply voltage line PL, and an initialization voltage line VIL.

A layer at which the first lines of the first line group HL may be arranged or disposed may be different from a layer at which the second lines of the second line group VL may be arranged or disposed. For example, at least one insulating layer may be arranged or disposed between the first lines and the second lines. In an embodiment, the first lines may be located or disposed over the second lines. In an embodiment, the second lines may be located or disposed over the first lines. FIG. 8 illustrates an example in which the second lines may be located or disposed over the first lines.

A pixel circuit of the second pixel PA may be arranged or disposed in a circuit area CA' where the first line group HL may intersect with the second line group VL. The pixel circuit of the second pixel PA may include the first pixel circuit PC1, the second pixel circuit PC2, and the third pixel circuit PC3, which may be arranged or disposed adjacent to each other in the x direction. The first pixel circuit PC1 may be electrically connected to the first sub-pixel Pa1. The second pixel circuit PC2 may be electrically connected to the second sub-pixel Pa2. The third pixel circuit PC3 may be electrically connected to the third sub-pixel Pa3.

The third sub-pixel Pa3 may overlap the circuit area CA' and may overlap the first line group HL and the second line group VL, which may pass through the first pixel circuit PC1, the second pixel circuit PC2, the third pixel circuit PC3, and the circuit area CA'. The first sub-pixel Pa1 may overlap the first line group HL, which may extend around the circuit area CA'. The second sub-pixel Pa2 may overlap the second line group VL, which may extend around the circuit area CA'.

The transmissive area TA may have a high light transmittance because display elements and lines may not be arranged or disposed therein. The transmissive area TA may be provided or disposed in plural in the second display area DA2.

Each of the first sub-pixel Pa1, the second sub-pixel Pa2, and the third sub-pixel Pa3 may include an organic light-emitting diode OLED. Each of the first pixel circuit PC1, the second pixel circuit PC2, and the third pixel circuit PC3 may be the pixel circuit shown in FIG. 4B.

Referring to FIG. 8, a substrate 100 may include glass or a polymer resin. The polymer resin may include polyethersulfone (PES), polyacrylate, polyetherimide (PEI), polyethylene napthalate (PEN), polyethyelene terephthalate (PET), polyphenylene sulfide (PPS), polyarylate, polyimide (PI), polycarbonate (PC), or cellulose acetate propionate (CAP). The substrate 100 including the polymer resin may be flexible, rollable, or bendable. The substrate 100 may have a multilayered structure including a layer including the above-described polymer resin and an inorganic layer (not shown).

A buffer layer 111 may be located or disposed on the substrate 100 and may reduce or block the penetration of a foreign material, moisture, or external air from a bottom of the substrate 100 and may provide a planar surface on the substrate 100. The buffer layer 111 may include an inorganic material, such as an oxide or a nitride, an organic material, or an organic-inorganic composite and include a single layer or a multilayered structure of an inorganic material and an organic material. A barrier layer (not shown) that may block the penetration of external air may be provided or disposed between the substrate 100 and the buffer layer 111. In an embodiment, the buffer layer 111 may include silicon oxide ($SiO_2$) or silicon nitride ($SiN_X$). The buffer layer 111 may include a first buffer layer 111a and a second buffer layer 111b, which may be stacked.

A lower electrode layer BSM may be arranged or disposed between the first buffer layer 111a and the second buffer layer 111b. In an embodiment, the lower electrode layer BSM may be arranged or disposed between the substrate 100 and the first buffer layer 111a. The lower electrode layer BSM may include a first lower electrode layer BSM1 arranged or disposed to correspond to the first pixel Pa1, a second lower electrode layer BSM2 arranged or disposed to correspond to the second pixel Pa2, and a third lower electrode layer BSM3 arranged or disposed to correspond to the third pixel Pa3. The third lower electrode layer BSM3 may be arranged or disposed to overlap the first pixel circuit PC1, the second pixel circuit PC2, and the third pixel circuit PC3. The third lower electrode layer BSM3 may be arranged or disposed under or below a thin-film transistor included in the pixel circuit and may prevent characteristics of the thin-film transistor from being degraded due to light emitted by a component 20. The first lower electrode layer BSM1 may be arranged or disposed to overlap the first line group HL, and the second lower electrode layer BSM2 may be arranged or disposed to overlap the second line group VL. As shown in FIGS. 8-10, the first lower electrode layer BSM1, the second lower electrode layer BSM2, and the third lower electrode layer BSM3 may be integrally formed as one lower electrode layer BSM to correspond to the first to third sub-pixels Pa1, Pa2, and Pa3. For example, the lower electrode layer BSM may include an opening corresponding to the transmissive area TA and may have a substantially lattice shape. The lower electrode layer BSM may have an area corresponding to the first line group HL, the second line group VL, and the second pixel PA and may overlap the first line group HL, the second line group VL, and the second pixel PA.

The lower electrode layer BSM may be electrically connected through a contact hole to a line located or disposed at a different layer, and may receive a constant voltage (for example, a power supply voltage ELVDD or an initialization voltage VINT) or a signal (for example, a scan signal) from the line. As the lower electrode layer BSM receives the constant voltage or the signal, the probability of generating electrostatic discharge may be markedly reduced. The lower electrode layer BSM may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The lower electrode layer BSM may include a single layer or a multilayered structure of the materials described above.

The first to third pixel circuits PC1, PC2, and PC3 may be arranged or disposed on the buffer layer 111. Referring to FIG. 6, a semiconductor layer ACT may be arranged or disposed on the circuit area CA' over the buffer layer 111. The semiconductor layer ACT may include polysilicon. In an embodiment, the semiconductor layer ACT may include amorphous silicon. In an embodiment, the semiconductor layer ACT may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn).

The semiconductor layer ACT may include a channel region, a source region, and a drain region of each of the first to seventh transistors T1 to T7. The channel region of the first transistor T1 may have bent portions and be formed long, and thus, a driving range of a gate voltage applied to a gate electrode may be extended. In various embodiments, the channel region of the first transistor T1 may have substantially '⊏' (for example, a substantially "C" shape), substantially '⊒' (a substantially "Z" shape) 'S,' 'M,' and 'W' shapes. The source region or the drain region may be a source electrode or a drain electrode of a transistor.

A first gate insulating layer 112 may be provided or disposed to cover or overlap the semiconductor layer ACT. The first gate insulating layer 112 may include an inorganic insulating material, such as silicon oxide (SiO2), silicon nitride (SiNx), silicon oxynitride (SiON), aluminum oxide (Al2O3), titanium oxide (TiO2), tantalum oxide (Ta2O5), hafnium oxide (HfO2), or zinc oxide (ZnO2). The first gate insulating layer 112 may include a single layer or a multi-layered structure including the inorganic insulating materials described above.

Gate electrodes of the first to seventh transistors T1 to T7 may be arranged or disposed on the first gate insulating layer 112 and may overlap the semiconductor layer ACT. The gate electrodes may include a single layer or a multilayered structure including molybdenum (Mo), aluminum (Al), copper (Cu), and titanium (Ti). In an example, gate electrodes of the first to seventh transistors T1 to T7 may be a single molybdenum layer.

The first scan line SL1, the second scan line SL2, the third scan line SL3, and the emission control line EL may be arranged or disposed over the first gate insulating layer 112 and may extend in the ±x direction. The first scan line SL1, the second scan line SL2, the third scan line SL3, and the emission control line EL may include the same or similar material at the same layer as the gate electrodes of the first to seventh transistors T1 to T7.

The gate electrode of the second transistor T2 and the gate electrode of the third transistor T3 may be portions of the first scan line SL1, which may intersect with the semiconductor layer ACT, or portions protruding from the first scan line SL1. The gate electrode of the fourth transistor T4 may be portions of the second scan line SL2, which may intersect with the semiconductor layer ACT, or portions protruding from the second scan line SL2. The gate electrode of the seventh transistor T7 may be portions of the third scan line SL3, which may intersect with the semiconductor layer ACT. The gate electrode of the fifth transistor T5 and the gate electrode of the sixth transistor T6 may be portions of the emission control line EL, which may intersect with the semiconductor layer ACT. A gate electrode G1 of the first transistor T1 may be provided as an island type or include an island type structure.

A second gate insulating layer 113 may be provided or disposed to cover or overlap the gate electrodes. The second gate insulating layer 113 may include an inorganic insulating material, such as silicon oxide, silicon nitride, silicon oxynitride, aluminum oxide, titanium oxide, tantalum oxide, hafnium oxide, or zinc oxide. The second gate insulating layer 113 may include a single layer or a multilayered structure of the inorganic insulating materials described above.

An upper electrode CE2 of a capacitor Cst may be arranged or disposed on the second gate insulating layer 113. In a first display area DA1, the upper electrode CE2 may overlap the gate electrode G1 located or disposed thereunder. The gate electrode G1 and the upper electrode CE2, which may overlap each other with the second gate insulating layer 113 therebetween, may constitute the capacitor Cst. The gate electrode G1 may be a lower electrode CE1 of the capacitor Cst. Upper electrodes CE2 of the respective capacitors Cst of the first to third pixel circuits PC1, PC2, and PC3 may be electrically connected to each other.

The upper electrode CE2 of the capacitor Cst may include aluminum, platinum, palladium, silver, magnesium, gold, nickel, neodymium, iridium, chromium, lithium, calcium, molybdenum, titanium, tungsten, and/or copper. The upper electrode CE2 of the capacitor Cst may include a single layer or a multilayered structure of the materials described above.

A repair line RL, which may include the same or similar material as the upper electrode CE2 of the capacitor Cst, may be arranged or disposed on the second gate insulating layer 113 and may extend in a ±x direction. The repair line RL may electrically connect a dummy pixel circuit located or disposed outside the second display area DA2 to a pixel electrode when defects may occur in the pixel circuit.

An interlayer insulating layer 115 may be formed or disposed to cover or overlap the upper electrode CE2. The interlayer insulating layer 115 may include silicon oxide, silicon nitride, silicon oxynitride, aluminum oxide, titanium oxide, tantalum oxide, hafnium oxide, or zinc oxide.

When the first gate insulating layer 112, the second gate insulating layer 113, and the interlayer insulating layer 115 are collectively referred to as an inorganic insulating layer IL, a structure in which the inorganic insulating layer IL may be stacked on the substrate 100 may have a transmittance of about 90% with respect to IR wavelengths. For example, light having a wavelength in a range of about 900 nm to about 1100 nm, which may pass through the substrate 100 and the inorganic insulating layer IL, may have a transmittance of about 90%.

The first data line DL1 electrically connected to the first pixel circuit PC1, the second data line DL2 electrically connected to the second pixel circuit PC2, and the third data line DL3 electrically connected to the third pixel circuit PC3 may be arranged or disposed on the interlayer insulating layer 115 and may extend in a ±y direction. Each of the first to third data lines DL1, DL2, and DL3 may be electrically connected to a portion of the semiconductor layer ACT corresponding to the second transistor T2.

The power supply voltage line PL and the initialization voltage line VIL may be arranged or disposed on the interlayer insulating layer 115 and may extend in the ±y direction. The power supply voltage line PL may include a first power supply voltage line PL1 electrically connected to the first pixel circuit PC1, a second power supply voltage line PL2 electrically connected to the second pixel circuit PC2, and a third power supply voltage line PL3 electrically connected to the third pixel circuit PC3. Each of the first power supply voltage line PL1 and the third power supply voltage line PL3 may be provided as an island pattern in the circuit area CA' and may be electrically connected to a portion of the semiconductor layer ACT corresponding to the upper electrode CE2 of the capacitor Cst and the fifth transistor T5. The second power supply voltage line PL2 may extend across the circuit area CA' and may be electrically connected to the portion of the semiconductor layer ACT corresponding to the upper electrode CE2 of the capacitor Cst and the fifth transistor T5. In an embodiment, since the first power supply voltage line PL1 and the third power supply voltage line PL3 may not extend around the circuit area CA', the number of second lines extending in the y direction may be reduced and the transmissive area TA may be increased or maximized.

The initialization voltage line VIL may be electrically connected to a portion of the semiconductor layer ACT corresponding to the fourth transistor T4 and a portion of the semiconductor layer ACT corresponding to the seventh transistor T7.

A node electrode NE may be arranged or disposed on the interlayer insulating layer 115. The node electrode NE may be electrically connected to the gate electrode of the first transistor T1 and a portion of the semiconductor layer ACT corresponding to the third transistor T3. The node electrode NE may be electrically connected to the gate electrode of the first transistor T1 through an opening in the upper electrode CE2 of the capacitor Cst.

A connection electrode CW may be arranged or disposed on the interlayer insulating layer 115. The connection electrode CW may be electrically connected to a portion of the semiconductor layer ACT corresponding to the sixth transistor T6.

The first to third data lines DL1, DL2, and DL3, the first to third power supply voltage lines PL1, PL2, and PL3, the initialization voltage line VIL, the node electrode NE, and the connection electrode CW may include a conductive material including molybdenum (Mo), aluminum (Al), copper (Cu), and titanium (Ti) and may include a single layer or a multilayered structure of the materials described above. In an example, the first to third data lines DL1, DL2, and DL3 may have a multilayered structure of Ti/Al/Ti.

FIG. 8 illustrates only the first transistor T1 and the capacitor Cst of each of the first pixel circuit PC1, the second pixel circuit PC2, and the third pixel circuit PC3 for ease and convenience of the explanation and for purposes of illustration.

A planarization layer 117 may be arranged or disposed on the first to third data lines DL1, DL2, and DL3. The planarization layer 117 may have a top surface, which may be planarized to planarize a pixel electrode arranged or disposed on the planarization layer 117.

The planarization layer 117 may include a single layer or a multilayered structure including an organic material film. The planarization layer 117 may include a general-purpose polymer, such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide polymer, an acryl ether polymer, an amide polymer, a fluorine polymer, a p-xylene polymer, a vinyl alcohol polymer, and/or a blend thereof.

The first sub-pixel Pa1, the second sub-pixel Pa2, and the third sub-pixel Pa3 may be arranged or disposed on the planarization layer 117. Referring to FIG. 7 together, the first sub-pixel Pa1 may include a first pixel electrode 221a, a first emission layer 223a, and an opposite electrode 225. The second sub-pixel Pa2 may include a second pixel electrode 221b, a second emission layer 223b, and the opposite electrode 225. The third sub-pixel Pa3 may include a third pixel electrode 221c, a third emission layer 223c, and the opposite electrode 225.

A first via hole VIA1, a second via hole VIA2, and a third via hole VIA3 may be defined in the planarization layer 117 and may overlap the first pixel electrode 221a, the second pixel electrode 221b, and the third pixel electrode 221c, respectively. The first pixel electrode 221a may be electrically connected to the first pixel circuit PC1 through the first via hole VIA1. The second pixel electrode 221b may be electrically connected to the second pixel circuit PC2 through the second via hole VIA2. The third pixel electrode 221c may be electrically connected to the third pixel circuit PC3 through the third via hole VIA3.

The third pixel electrode 221c and the third emission layer 223c of the third sub-pixel Pa3 may overlap the first to third pixel circuits PC1, PC2, and PC3. The first pixel electrode 221a and the first emission layer 223a of the first sub-pixel Pa1 may overlap the first line group HL, which may extend around (or may detour) the first to third pixel circuits PC1, PC2, and PC3. The second pixel electrode 221b and the second emission layer 223b of the second sub-pixel Pa2 may overlap the second line group VL, which may extend around the first to third pixel circuits PC1, PC2, and PC3.

The first to third pixel electrodes 221a, 221b, and 221c may include a conductive oxide, such as indium tin oxide (ITO), indium zinc oxide (IZO), zinc oxide (ZnO), indium oxide (In2O3), indium gallium oxide (IGO), or aluminum zinc oxide (AZO). The first to third pixel electrodes 221a, 221b, and 221c may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In an embodiment, the first to third pixel electrodes 221a, 221b, and 221c may include a film including ITO, IZO, ZnO, or In2O3 on and/or under or below the reflective film described above. In an embodiment, the first to third pixel electrodes 221a, 221b, and 221c may include a stack structure of ITO/Ag/ITO.

The first to third pixel electrodes 221a, 221b, and 221c may be in electrical contact with the connection electrode CW through the first to third via holes VIA1, VIA2, and VIA3 formed or disposed in the planarization layer 117 and electrically connected to a transistor electrically connected to the connection electrode CW.

A pixel defining layer 119 may cover or overlap edges of the first to third pixel electrodes 221a, 221b, and 221c. The pixel defining layer 119 may include openings OP defining respective emission areas EA1, EA2, and EA3 of the first to third sub-pixels Pa1, Pa2, and Pa3 and overlapping the first to third pixel electrodes 221a, 221b, and 221c. The pixel defining layer 119 may increase distances between the edges of the first to third pixel electrodes 221a, 221b, and 221c and the opposite electrode 225 and may prevent arcs from being generated at the edges of the first to third pixel electrodes 221a, 221b, and 221c. The pixel defining layer 119 may include an organic insulating material, such as polyimide, polyamide, an acrylic resin, BCB, HMDSO, and a phenolic resin, and may be formed by a spin coating process. However, the disclosure is not limited thereto and other processes may be employed in the formation of the pixel defining layer 119.

When the planarization layer 117 and the pixel defining layer 119 are collectively referred to as an organic insulating layer OL, the organic insulating layer OL may have a transmittance of about 90% or higher with respect to IR wavelengths. For example, light having a wavelength in a range of about 900 nm to about 1100 nm, which may pass through the organic insulating layer OL, may have a transmittance of about 90%.

The first to third emission layers 223a, 223b, and 223c may be arranged or disposed inside the openings OP of the pixel defining layer 119 to correspond to the first to third pixel electrodes 221a, 221b, and 221c, respectively. The first to third emission layers 223a, 223b, and 223c may include a polymer material or a monomer material and may emit red light, green light, and blue light or white light. In FIG. 7, each of the first to third emission layers 223a, 223b, and 223c may have a substantially rectangular shape. A size of the emission area EA3 of the third sub-pixel Pa3 (or a size of the third emission layer 223c) may be greater than a size of the emission area EA1 of the first sub-pixel Pa1 (or a size of the first emission layer 223a) and/or a size of the emission area EA2 of the second sub-pixel Pa2 (or a size of the first emission layer 223a).

The first to third emission layers 223a, 223b, and 223c may not overlap the first to third via holes VIA1, VIA2, and VIA3 formed or disposed in the planarization layer 117. For example, the first to third via holes VIA1, VIA2, and VIA3 may be located or disposed apart or offset from (or may deviate from) the first to third emission layers 223a, 223b, and 223c, respectively. The pixel defining layer 119 may overlap the first to third via holes VIA1, VIA2, and VIA3 formed or disposed in the planarization layer 117.

As shown in FIG. 7, the first via hole VIA1 and the second via hole VIA2 may be between opposite sides (facing sides) of the third emission layer 223c and the second emission layer 223b.

An organic functional layer may be arranged or disposed on and/or under or below the first to third emission layers 223a, 223b, and 223c. The organic functional layer may include a first functional layer 222 and/or a second functional layer 224. The first functional layer 222 or the second functional layer 224 may be omitted.

The first functional layer 222 may be arranged or disposed under or below the first to third emission layers 223a, 223b, and 223c. The first functional layer 222 may include a single layer or a multilayered structure including an organic material. Although not illustrated, the first functional layer 222 may include a hole transport layer (HTL) having a single-layered structure. Although not illustrated, alternatively, the first functional layer 222 may include a hole injection layer (HIL) and an HTL. The first functional layer 222 may be integrally formed to correspond to the first to third sub-pixels Pa1, Pa2, and Pa3.

The second functional layer 224 may be arranged or disposed on the first to third emission layers 223a, 223b, and 223c. The second functional layer 224 may include a single layer or a multilayered structure including an organic material. Although not illustrated, the second functional layer 224 may include an electron transport layer (ETL) and/or an electron injection layer (EIL). The second functional layer 224 may be integrally formed to correspond to the first to third sub-pixels Pa1, Pa2, and Pa3.

The opposite electrode 225 may be arranged or disposed on the second functional layer 224. The opposite electrode 225 may include a conductive material having a small work function. For example, the opposite electrode 225 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the opposite electrode 225 may include a layer including, for example, ITO, IZO, ZnO, or In2O3 on the (semi)transparent layer including the material described above. The opposite electrode 225 may be integrally formed to correspond to the first to third sub-pixels Pa1, Pa2, and Pa3. As shown in FIG. 7, similarly to the lower electrode layer BSM, the opposite electrode 225 may include an opening corresponding to the transmissive area TA and may have a lattice shape. The opposite electrode 225 may have an area corresponding to the first line group HL, the second line group VL, and the second pixel PA and may overlap the first line group HL, the second line group VL, and the second pixel PA.

An upper layer 250 including an organic material may be formed or disposed on the opposite electrode 225. The upper layer 250 may be provided or included to protect the opposite electrode 225 and simultaneously, may increase light extraction efficiency. The upper layer 250 may include an organic material having a higher refractive index than the opposite electrode 225. Alternatively, the upper layer 250 may be provided by stacking layers having different refractive indices. For example, the upper layer 250 may be provided by stacking a high refractive index layer, a low refractive index layer, and a high refractive index layer. In this case, the high refractive index layer may have a refractive index of about 1.7 or more, and the low refractive index layer may have a refractive index of about 1.3 or less.

The upper layer 250 may include lithium fluoride (LiF). Alternatively, the upper layer 250 may include an inorganic insulating material, such as silicon oxide and silicon nitride.

In an embodiment, the first functional layer 222, the second functional layer 224, the opposite electrode 225, and the upper layer 250 may include an opening TAH corresponding to the transmissive area TA. For example, the first functional layer 222, the second functional layer 224, the opposite electrode 225, and the upper layer 250 may have respective openings corresponding to the transmissive area TA. In an embodiment, the openings of the first functional layer 222, the second functional layer 224, the opposite electrode 225, and the upper layer 250, which may form the opening TAH, may have substantially the same width. For example, a width of the opening of the opposite electrode 225 may be substantially equal to a width of the opening TAH. In an embodiment, the first functional layer 222, the second functional layer 224, and the upper layer 250 may be omitted. In this case, the opening of the opposite electrode 225 may form the opening TAH corresponding to the transmissive area TA.

A first hole H1, a second hole H2, and a third hole H3, each of which may correspond to the transmissive area TA, may be respectively formed in the inorganic insulating layer IL, the planarization layer 117, and the pixel defining layer 119.

It will be understood that when the opening TAH is referred to as corresponding to the transmissive area TA, the opening TAH may overlap the transmissive area TA. In this case, an area of the opening TAH may be less than each of an area of the first hole H1 formed or disposed in the inorganic insulating layer IL, an area of the second hole H2 formed or disposed in the planarization layer 117, and an area of the third hole H3 formed or disposed in the pixel defining layer 119. FIG. 8 illustrates a case in which a width Wt of the opening TAH may be less than each of a width W1 of the first hole H1, a width W2 of the second hole H2, and a width W3 of the third hole H3. Here, each of the area of the opening TAH and the areas of the first to third holes H1, H2, and H3 may be defined as a minimum area of each corresponding opening.

In an embodiment, the first functional layer 222, the second functional layer 224, the opposite electrode 225, and the upper layer 250 may be arranged or disposed on side surfaces of the first hole H1, the second hole H2, and the third hole H3. In an embodiment, slopes of the side surfaces of the first hole H1, the second hole H2, and third hole H3 with respect to a top surface of the substrate 100 may be substantially smoother than a slope of a side surface of the opening TAH with respect to the top surface of the substrate 100.

Since the formation of the opening TAH may indicate that a part of a member (for example, the opposite electrode 225) corresponding to the transmissive area TA may be removed, a light transmittance of the transmissive area TA may be significantly increased.

Different from that of the embodiment of FIG. 8, as shown in FIG. 9, the opposite electrode 225 may include an opening corresponding to the transmissive area TA, and at least one of the first functional layer 222, the second functional layer 224, and the upper layer 250 may be arranged or disposed to correspond to the transmissive area TA. For example, at least one of the first functional layer 222, the second functional layer 224, and the upper layer 250 may be arranged or disposed inside the opening TAH. A width of the opening of the opposite electrode 225 may be substantially equal to a width of the opening TAH of the transmissive area TA. In this case, the opposite electrode 225 may be formed using a mask including a shielding film that may cover or overlap the transmissive area TA.

The first to third sub-pixels Pa1, Pa2, and Pa3 may be sealed by a thin-film encapsulation layer 300. The thin-film encapsulation layer 300 may be arranged or disposed on the upper layer 250. The thin-film encapsulation layer 300 may prevent the penetration of external moisture or foreign materials into the first to third sub-pixels Pa1, Pa2, and Pa3.

The thin-film encapsulation layer 300 may include at least one inorganic encapsulation layer and at least one organic encapsulation layer. In this regard, FIG. 8 illustrates a case in which the thin-film encapsulation layer 300 may have a stack structure of a first inorganic encapsulation layer 310, an organic encapsulation layer 320, and a second inorganic encapsulation layer 330. In an embodiment, the number of organic encapsulation layers, the number of inorganic encapsulation layers, and the order of stacking of organic encapsulation layers and inorganic encapsulation layers may be changed within the spirit and the scope of the disclosure.

The first inorganic encapsulation layer 310 and the second inorganic encapsulation layer 330 may include at least one inorganic insulating material, such as aluminum oxide, titanium oxide, tantalum oxide, hafnium oxide, zinc oxide, silicon oxide, silicon nitride, or silicon oxynitride, and may be formed by a chemical vapor deposition (CVD) process. The organic encapsulation layer 320 may include a polymer-based material. The polymer-based material may include a silicone-based resin, an acrylic resin, an epoxy resin, polyimide, and polyethylene, by way of example.

The first inorganic encapsulation layer 310, the organic encapsulation layer 320, and the second inorganic encapsulation layer 330 may be integrally formed or disposed to cover or overlap a first display area DA1 and a second display area DA2. Thus, the first inorganic encapsulation layer 310, the organic encapsulation layer 320, and the second inorganic encapsulation layer 330 may be arranged or disposed inside the opening region TAH.

In an embodiment, the organic encapsulation layer 320 may be formed to cover or overlap the second display area DA2 but may not be present in the transmissive area TA. For example, the organic encapsulation layer 320 may include the opening TAH corresponding to the transmissive area TA. In this case, the first inorganic encapsulation layer 310 and the second inorganic encapsulation layer 330 may be in contact with each other inside the opening TAH.

Different from that of the display device described with reference to FIGS. 8 and 9, which may include the thin-film encapsulation layer 300 serving as an encapsulation member, as shown in FIG. 10, the display device may include an encapsulation substrate 300' serving as an encapsulation member. The first to third sub-pixels Pa1, Pa2, and Pa3 may be covered or overlapped by the encapsulation substrate 300'. The encapsulation substrate 300' may include a transparent material. For instance, the encapsulation substrate 300' may include a glass material. Alternatively, the encapsulation substrate 300' may include a polymer resin. The encapsulation substrate 300' may prevent the penetration of external moisture or foreign materials into the first to third sub-pixels Pa1, Pa2, and Pa3. A sealing material, such as a sealant, may be arranged or disposed between the substrate 100 and the encapsulation substrate 300'. The sealing material may block the penetration of external moisture or foreign materials through a space between the substrate 100 and the encapsulation substrate 300'.

A component 20 may be arranged or disposed under or below the second display area DA2. The component 20 may include a camera that may capture an image or images or an IR sensor that may transmit and receive IR light. Since the transmissive area TA may be arranged or disposed in the second display area DA2, light emitted by or incident to the component 20 may be transmitted through the transmissive area TA. For example, light emitted by the component 20 may travel in a +z direction through the transmissive area TA, while light that may be generated outside the display device and incident to the component 20 may travel in a −z direction through the transmissive area TA. In an embodiment, the component 20 may include image sensors, which may be arranged or disposed to correspond to the transmissive area's TA in a one-to-one manner or correspondence.

Figure 11A:
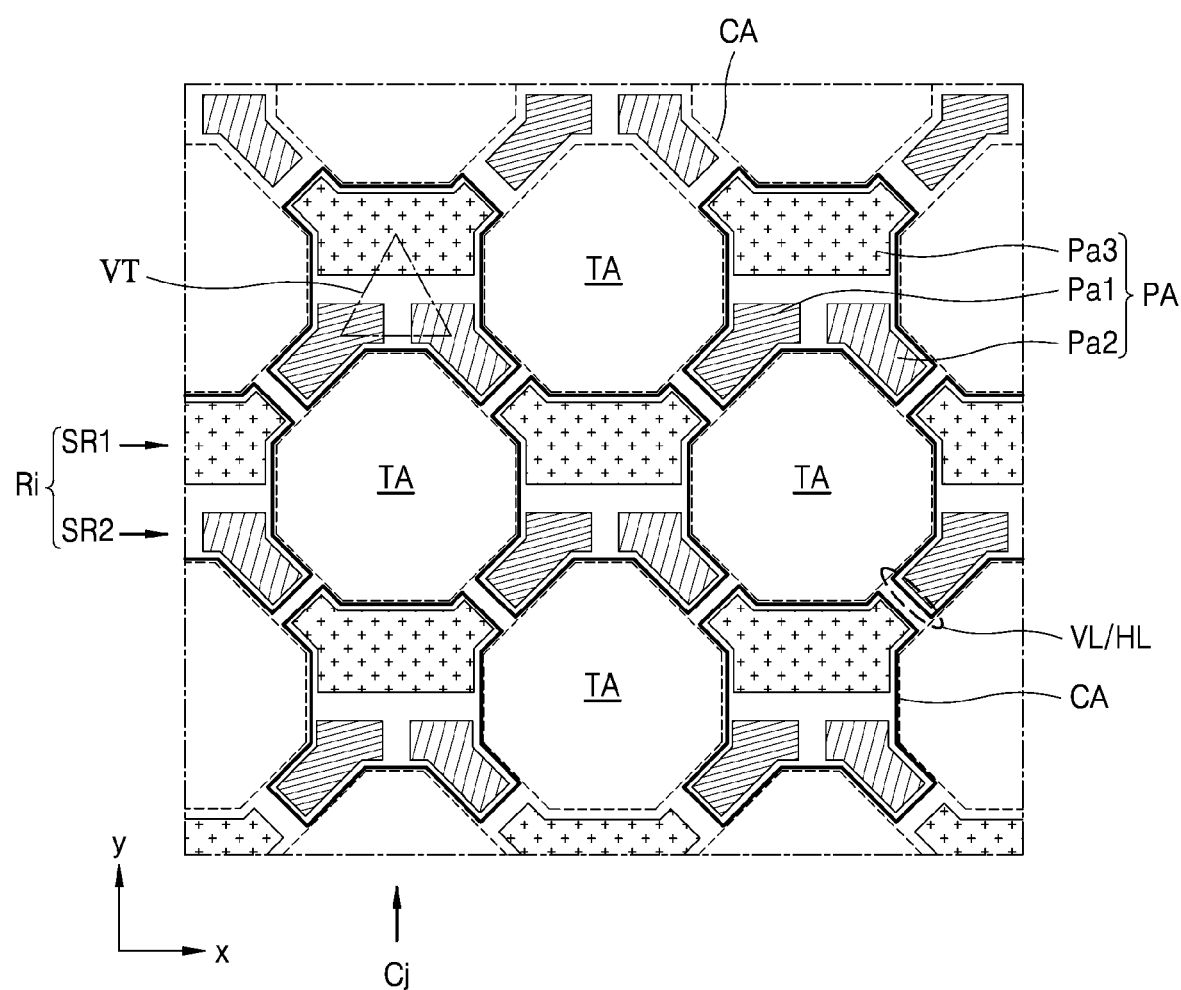
FIG. 11A is a schematic plan view showing the arrangement of pixels in a second display area according to an embodiment.
Figure 11B:
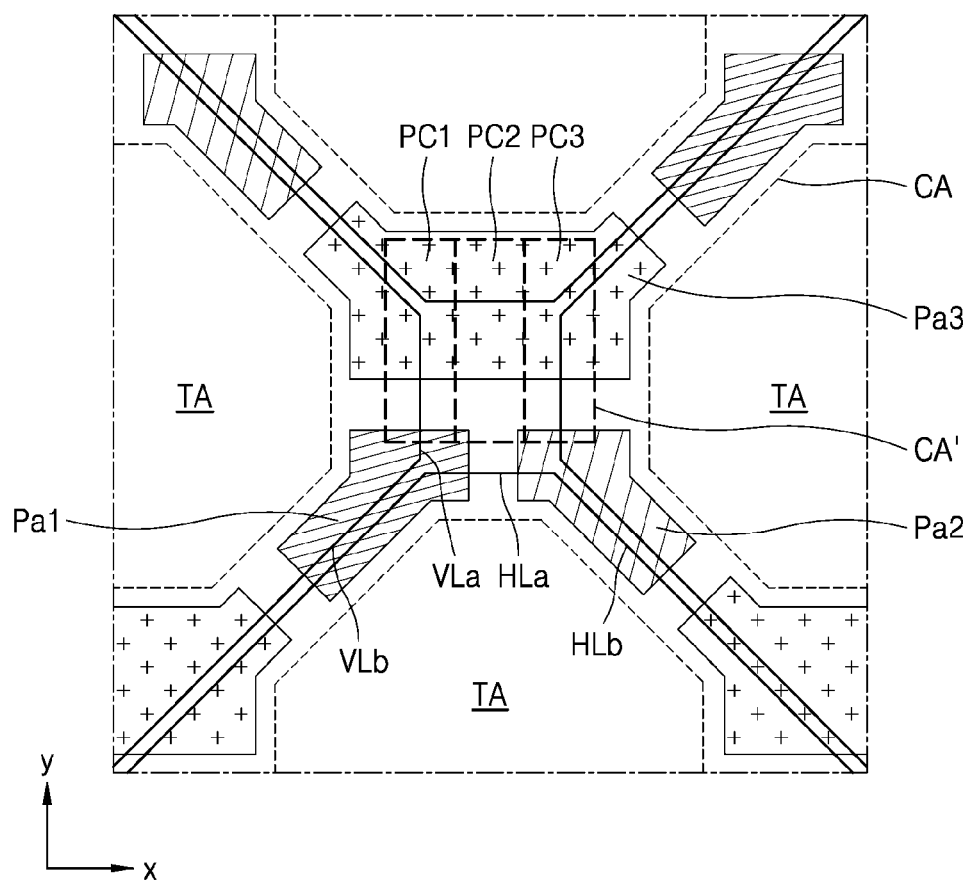
FIG. 11B is an enlarged view of a second pixel of FIG. 11A.
Figure 12:
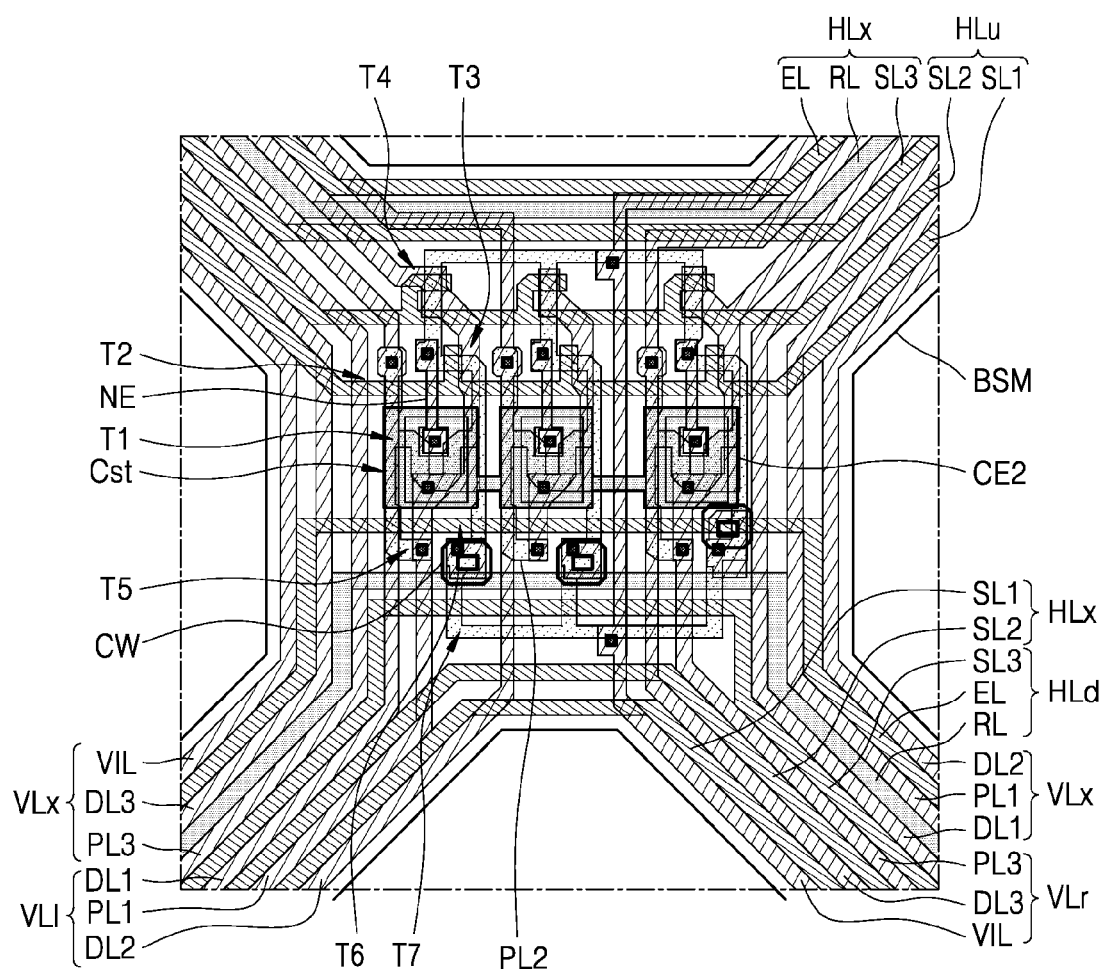
FIGS. 12 and 13 are schematic layout diagrams showing positions of pixel circuits, lines, and sub-pixels of the second pixel shown in FIG. 11A.
Figure 13:
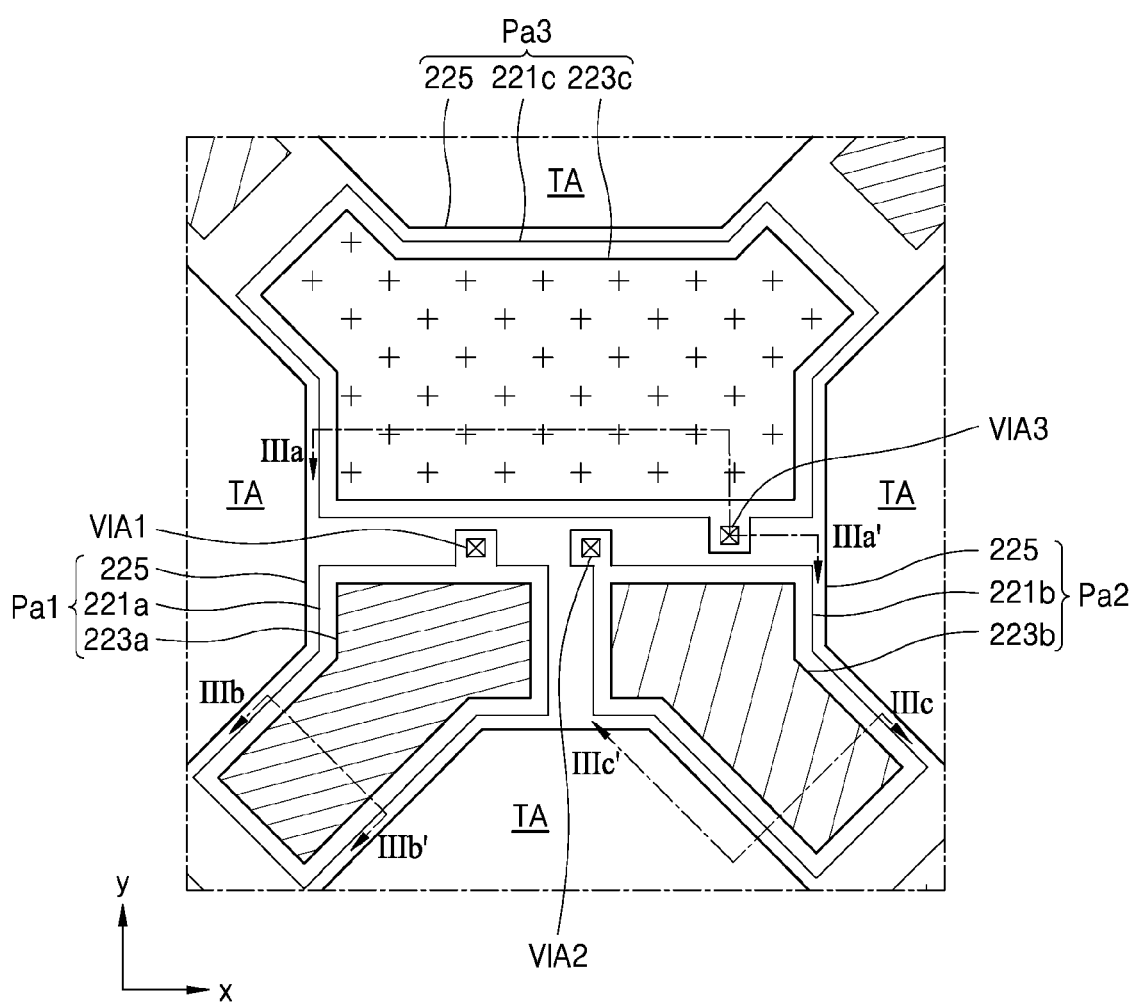
Figure 14:
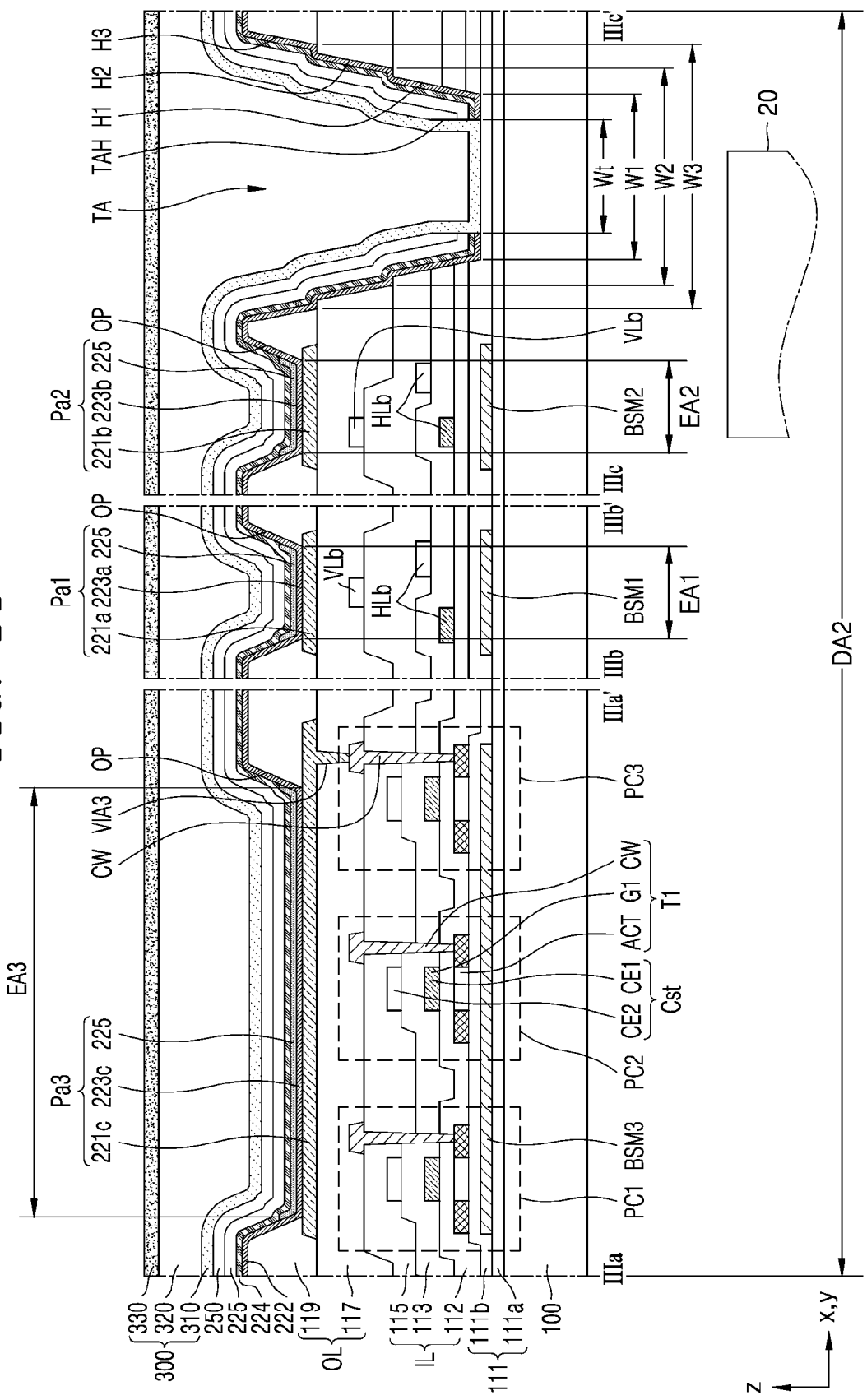
FIG. 14 is a schematic cross-sectional view of the second pixel, which is taken along lines IIIa-IIIa', IIIb-IIIb', and IIIc-IIIc' of FIG. 13.

FIG. 11A is a schematic plan view showing the arrangement of pixels in a second display area DA2 according to an embodiment. FIG. 11B is an enlarged view of a second pixel PA of FIG. 11A. FIGS. 12 and 13 are schematic layout diagrams showing positions of pixel circuits, lines, and sub-pixels of the second pixel PA shown in FIG. 11A. FIG. 14 is a schematic cross-sectional view of the second pixel PA, which is taken along lines IIIa-IIIa', IIIb-IIIb', and IIIc-IIIc' of FIG. 13.

Referring to FIG. 11A, the second display area DA2 of a display device may include a non-transmissive area CA and a transmissive area TA surrounded by the non-transmissive area CA.

Second pixels PA may be repetitively arranged or disposed in an ±x direction (row direction) and a ±y direction (column direction) in the non-transmissive area CA. The second pixel PA may be arranged or disposed in a substantially zigzag arrangement. For example, the second pixels PA may be arranged or disposed in odd rows and even columns and in even rows and odd columns. Alternatively, the second pixels PA may be arranged or disposed in odd rows and odd columns and in even rows and even columns. Thus, a resolution of the second display area DA2 may be lower than that of a first display area DA1.

The second pixel PA may include sub-pixels. The second pixel PA may include a first sub-pixel Pa1, a second sub-pixel Pa2, and a third sub-pixel Pa3, which may be respectively arranged or disposed at vertices of an imaginary triangle VT. One third sub-pixel Pa3 may be provided or disposed to correspond to one first sub-pixel Pa1 and one second sub-pixel Pa2, and thus, a size of the third sub-pixel Pa3 may be greater than sizes of the first sub-pixel Pa1 and the second sub-pixel Pa2. The first sub-pixel Pa1, the second sub-pixel Pa2, and the third sub-pixel Pa3 may respectively render different colors. For example, the first sub-pixel Pa1, the second sub-pixel Pa2, and the third sub-pixel Pa3 may render red, green, and blue, respectively.

The third sub-pixel Pa3 may be repetitively arranged or disposed in the ±x direction in a first sub-row SR1 of each row Ri. The first sub-pixel Pa1 and the second sub-pixel Pa2 may be alternately arranged or disposed in the ±x direction in a second sub-row SR2 of each row Ri.

A first line group HL and a second line group VL may be arranged or disposed in the non-transmissive area CA. As shown in FIG. 11B, each of first lines of the first line group HL may include a first portion HLa extending in the x direction and a pair of second portions HLb, which are bent from the first portion HLa and extend in directions (for example, an oblique direction and a reverse oblique direction) between the x direction and the y direction. Each of second lines of the second line group VL may include a first portion VLa extending in the y direction and a pair of second portions VLb, which may be bent from the first portion VLa and extend in directions (for example, the oblique direction and the reverse oblique direction) between the x direction and the y direction. The first portions HLa of the first lines arranged or disposed in different rows may be connected by the second portions HLb of the first lines between neighboring rows. The first portions VLa of the second lines arranged or disposed in different rows may be connected by the second portions VLb of the second lines between neighboring rows. The oblique and reverse directions may be third and fourth directions, for example. The fourth direction may be line symmetrical to the third direction.

A pixel circuit of the second pixel PA may be arranged or disposed in a circuit area CA' where the first portions HLa of the first lines may intersect with the first portions VLa of the second lines. The pixel circuit of the second pixel PA may include a first pixel circuit PC1, a second pixel circuit PC2, and a third pixel circuit PC3, which may be arranged or disposed adjacent to each other in the x direction. The first pixel circuit PC1 may be electrically connected to the first sub-pixel Pa1. The second pixel circuit PC2 may be electrically connected to the second sub-pixel Pa2. The third pixel circuit PC3 may be electrically connected to the third sub-pixel Pa3.

The pair of second portions HLb of each of the first lines and the pair of second portions VLb of each of the second lines may be respectively arranged or disposed in a diagonal direction and a reverse diagonal direction from the circuit area CA'.

As shown in FIG. 12, the first lines of the first line group HL may include a first scan line SL1, a second scan line SL2, a third scan line SL3, a repair line RL, and an emission control line EL. The first line group HL may be divided into a 1-1-th line group HLu and a 1-2-th line group HLd. The 1-1-th line group HLu may include the first scan line SL1 and second scan line SL2, which may be arranged or disposed on an upper side of the circuit area CA'. The 1-2-th line group HLd may include the third scan line SL3, the repair line RL, and the emission control line EL, which may be arranged or disposed on a lower side of the circuit area CA'. A portion HLx of the first line group HL, which may pass through the circuit area CA' of a neighboring second pixel PA, may be arranged or disposed outside the 1-1-th line group HLu and the 1-2-th line group HLd.

The second lines of the second line group VL may include a first data line DL1 and a first power supply voltage line PL1, which may be electrically connected to the first pixel circuit PC1, a second data line DL2 electrically connected to the second pixel circuit PC2, a third data line DL3 and a third power supply voltage line PL3, which may be electrically connected to the third pixel circuit PC3, and an initialization voltage line VIL electrically connected to the first to third pixel circuits PC1, PC2, and PC3. A second power supply voltage line PL2 may be electrically connected to the second pixel circuit PC2 may be provided as an island pattern in the circuit area CA' and may be electrically connected to an upper electrode CE2 of a capacitor Cst. Each of the first power supply voltage line PL1 and the third power supply voltage line PL3 may be electrically connected to the upper electrode CE2 of the capacitor Cst.

The second line group VL may be divided into a 2-1-th line group VLl and a 2-2-th line group VLr. The 2-1-th line group VLl may include the first data line DL1, the second data line DL2, and the first power supply voltage line PL1, which may be arranged or disposed on a left side of the circuit area CA'. The 2-2-th line group VLr may include the third data line DL3, the third power supply voltage line PL3, and the initialization voltage line VIL, which may be arranged or disposed on a right side of the circuit area CA'.

A portion VLx of the second line group VL, which may pass through the circuit area CA' of a neighboring second pixel PA, may be arranged or disposed outside the 2-1-th line group VLl and 2-2-th line group VLr.

The third sub-pixel Pa3 may overlap the circuit area CA' and may overlap the first line group HL and the second line group VL, which may pass through the circuit area CA', the first pixel circuit PC1, the second pixel circuit PC2, and the third pixel circuit PC3. Each of the first sub-pixel Pa1 and the second sub-pixel Pa2 may overlap the first line group HL and the second line group VL, which may be arranged or disposed around (or may detour) the circuit area CA'. As shown in FIG. 14, each of the first sub-pixel Pa1 and the second sub-pixel Pa2 may overlap the second portions HLb of the first line group HL and the second portions VLb of the second line group VL.

A layer at which the first lines of the first line group HL may be arranged or disposed may be different from a layer at which the second lines of the second line group VL may be arranged or disposed. Thus, the first lines may overlap the second lines or gaps between the first lines and the second lines may be minimized.

The lines included in the first line group HL and the second line group VL may be divided and arranged or disposed in the diagonal direction and the reverse diagonal direction around the circuit area CA', and the gaps between the first lines and the second lines may be minimized. Thus, the overall width of an area occupied by the lines may be reduced so that the transmissive area TA may be increased or maximized.

A first via hole VIA1, a second via hole VIA2, and a third via hole VIA3, which may overlap a first pixel electrode 221a, a second pixel electrode 221b, and a third pixel electrode 221c, respectively, may be formed or disposed in a planarization layer 117.

Each of the first to third pixel electrodes 221a, 221b, and 221c and first to third emission layers 223a, 223b, and 223c may have a substantially polygonal shape. Each of the third pixel electrode 221c and the third emission layer 223c may include a long portion in the x direction and portions protruding in the diagonal direction and the reverse diagonal direction from the long portion thereof. Each of the first pixel electrode 221a and the first emission layer 223a may include a long portion in the x direction and a portion protruding long in the diagonal direction from the long portion thereof. Each of the second pixel electrode 221b and the second emission layer 223b may include a long portion in the x direction and a portion protruding long in the reverse diagonal direction from the long portion thereof. Shapes of the second pixel electrode 221b and the second emission layer 223b may be substantially the same as shapes of the first pixel electrode 221a and the first emission layer 223a, respectively.

A size of an emission area EA3 of the third sub-pixel Pa3 (or a size of the third emission layer 223c) may be greater than a size of an emission area EA1 of the first sub-pixel Pa1 (or a size of the first emission layer 223a) and a size of an emission area EA2 of the second sub-pixel Pa2 (or a size of the second emission layer 223b). The size of the emission area EA1 of the first sub-pixel Pa1 (or the size of the first emission layer 223a) may be substantially equal to the size of the emission area EA2 of the second sub-pixel Pa2 (or the size of the second emission layer 223b).

As shown in FIG. 13, the first to third emission layers 223a, 223b, and 223c may not overlap the first to third via holes VIA1, VIA2, and VIA3. For example, the first to third via holes VIA1, VIA2, and VIA3 may be spaced apart or offset from (or may deviate from) the first to third emission layers 223a, 223b, and 223c, respectively. The first to third via holes VIA1, VIA2, and VIA3 may be between opposite sides of the first emission layer 223a and the third emission layer 223c and between opposite sides (facing sides) of the second emission layer 223b and the third emission layer 223c. The pixel defining layer 119 may overlap the first to third via holes VIA1, VIA2, and VIA3.

Figure 15:
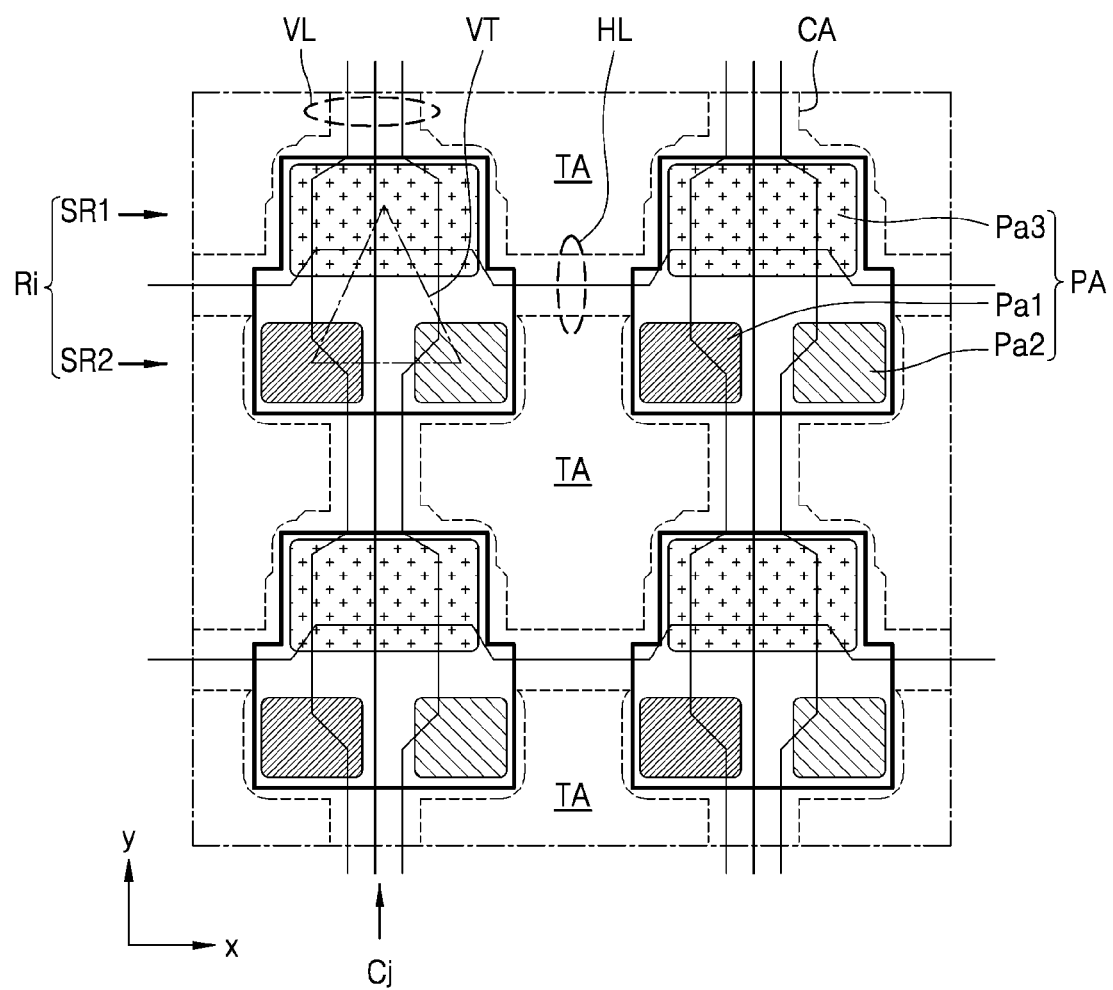
FIG. 15 is a schematic plan view showing the arrangement of pixels in a second display area according to an embodiment.
Figure 16:
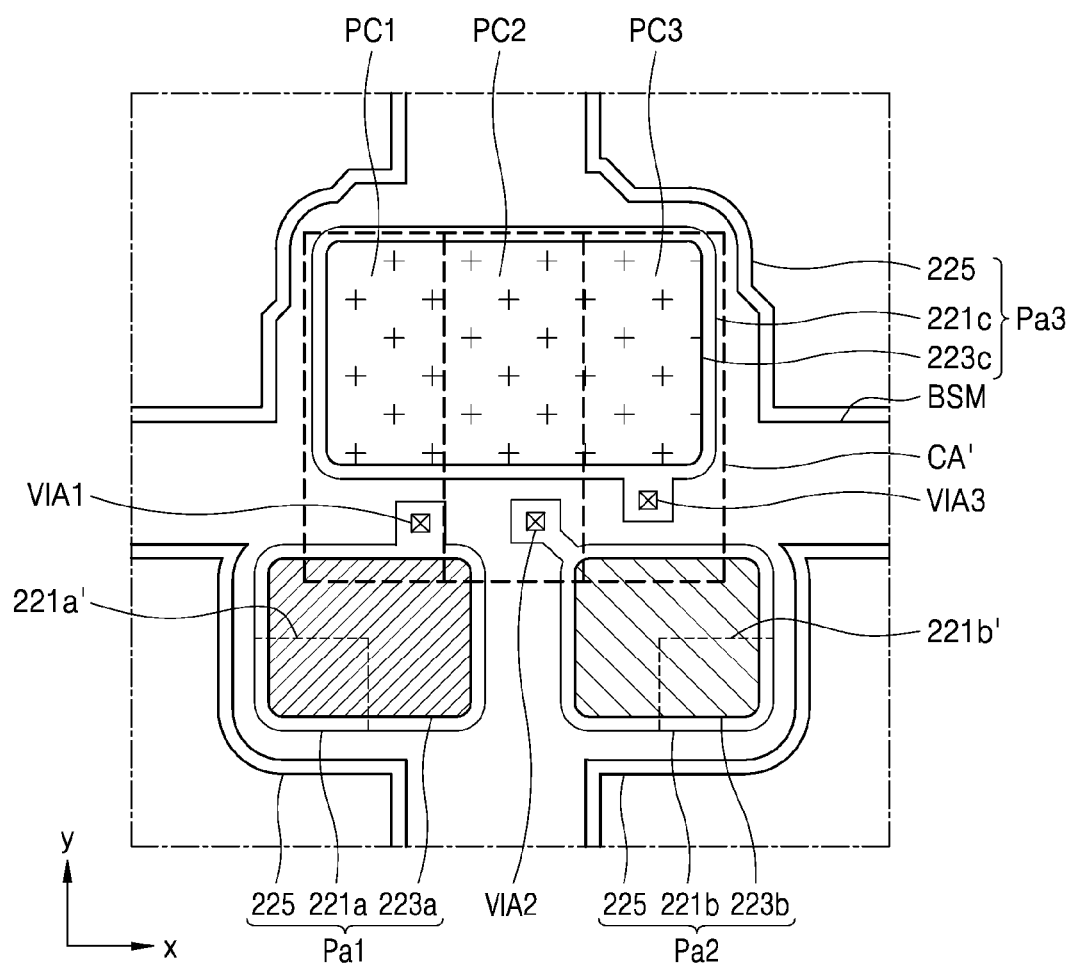
FIG. 16 is an enlarged view of a second pixel of FIG. 15.

FIG. 15 is a schematic plan view showing the arrangement of pixels in a second display area DA2 according to an embodiment. FIG. 16 is an enlarged view of a second pixel PA of FIG. 15.

Since a pixel circuit of the second pixel of FIGS. 15 and 16 may be the same as the pixel circuit shown in FIG. 7, a description thereof will be omitted.

Referring to FIG. 15, the second display area DA2 of a display device may include a non-transmissive area CA and a transmissive area TA surrounded by the non-transmissive area CA. Second pixels PA may be repetitively arranged or disposed in an ±x direction (row direction) and a ±y direction (column direction) in the non-transmissive area CA.

The second pixel PA may include sub-pixels. The second pixel PA may include a first sub-pixel Pa1, a second sub-pixel Pa2, and a third sub-pixel Pa3, which may be respectively arranged or disposed at vertices of an imaginary triangle VT. The first sub-pixel Pa1, the second sub-pixel Pa2, and the third sub-pixel Pa3 may respectively render different colors. For example, the first sub-pixel Pa1, the second sub-pixel Pa2, and the third sub-pixel Pa3 may render red, green, and blue, respectively.

The third sub-pixel Pa3 may be arranged or disposed in an x direction in a first sub-row SR1 of each row Ri, and a first sub-pixel Pa1 and a second sub-pixel Pa2 may be alternately arranged or disposed in the x direction in a second sub-row SR2 of each row Ri. One third sub-pixel Pa3 may be provided or disposed to correspond to one first sub-pixel Pa1 and one second sub-pixel Pa2. Thus, a size of the third sub-pixel Pa3 may be greater than sizes of the first sub-pixel Pa1 and the second sub-pixel Pa2. A length of the third sub-pixel Pa3 in the x direction may be equal to or greater than the sum of a length of the first sub-pixel Pa1 in the x direction and a length of the second sub-pixel Pa2 in the x direction.

In the non-transmissive area CA, a first line group HL may be arranged or disposed in each row Ri, and a second line group VL may be arranged or disposed in each column Ci. Although one first line and three second lines may be illustrated in FIG. 15 for convenience of explanation and for purposes of illustration, the disclosure is not limited thereto. For example, as shown in FIGS. 5B and 6, first lines may include a first scan line SL1, a second scan line SL2, a third scan line SL3, an emission control line EL, and a repair line RL. Second lines may include a first data line DL1 electrically connected to a first pixel circuit PC1, a second data line DL2 electrically connected to a second pixel circuit PC2, a third data line DL3 electrically connected to a third pixel circuit PC3, a power supply voltage line PL, and an initialization voltage line VIL.

As shown in FIG. 16, the pixel circuit of the second pixel PA may be arranged or disposed in a circuit area CA' where first line group HL may intersect with the second line group VL.

The third sub-pixel Pa3 may overlap the circuit area CA' and may overlap the first line group HL and the second line group VL, which may pass through the circuit area CA', the first pixel circuit PC1, the second pixel circuit PC2 and the third pixel circuit PC3. The first sub-pixel Pa1 and the second sub-pixel Pa2 may partially overlap the first line group HL and the second line group VL, which may extend around (or may detour) the circuit area CA'. The pixel circuit and lines may not be arranged or disposed under or below a portion 221a' of a first pixel electrode 221a of the first sub-pixel Pa1 and a portion 221b' of a second pixel electrode 221b of the second sub-pixel Pa2.

Each of the lower electrode layer BSM and the opposite electrode 225 may include an opening corresponding to the transmissive area TA and may have a lattice shape. The lower electrode layer BSM and the opposite electrode 225 may have areas corresponding to the non-transmissive area CA and may overlap the first line group HL, the second line group VL, and the second pixel PA.

Figure 17:
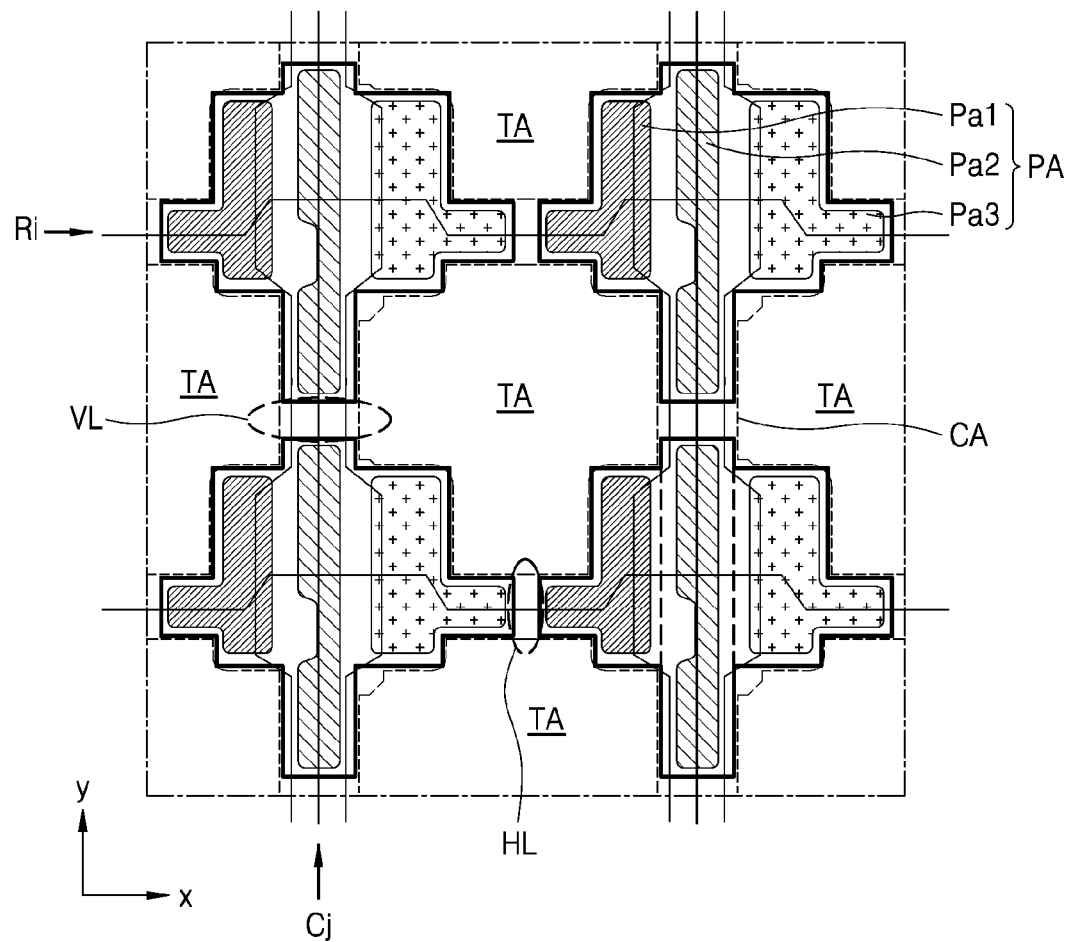
FIG. 17 is a schematic plan view showing the arrangement of pixels in a second display area according to an embodiment.
Figure 18:
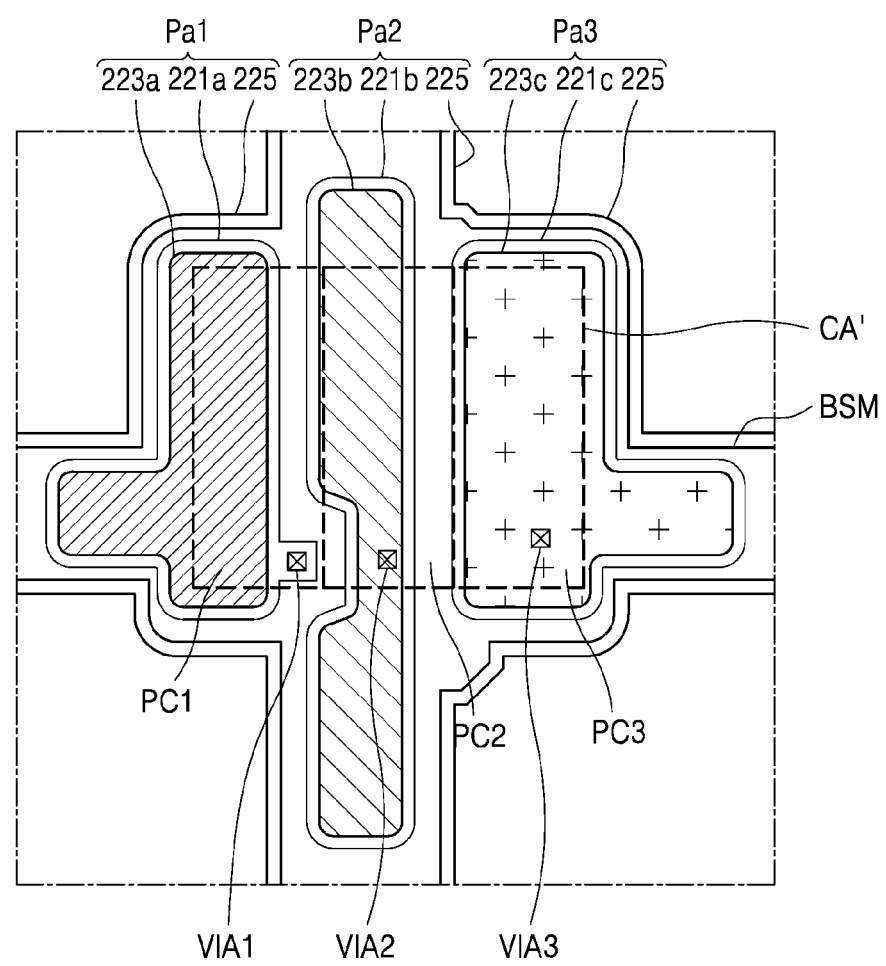
FIG. 18 is an enlarged view of a second pixel of FIG. 17.

FIG. 17 is a schematic plan view showing the arrangement of pixels in a second display area DA2 according to an embodiment. FIG. 18 is an enlarged view of a second pixel PA of FIG. 17.

Since a pixel circuit of the second pixel PA shown in FIGS. 17 and 18 may be the same as the pixel circuit shown in FIG. 7, a description thereof will be omitted.

Referring to FIG. 17, the second display area DA2 of a display device may include a non-transmissive area CA and a transmissive area TA surrounded by the non-transmissive area CA. Second pixels PA may be repetitively arranged or disposed in an ±x direction (row direction) and a ±y direction (column direction) in the non-transmissive area CA.

A first sub-pixel Pa1, a second sub-pixel Pa2, and a third sub-pixel Pa3 may be alternately arranged or disposed in the x direction in each row Ri. Each of first to third pixel electrodes 221a, 221b, and 221c and first to third emission layers 223a, 223b, and 223c may have a substantially polygonal shape. As shown in FIG. 18, each of the first pixel electrode 221a and the first emission layer 223a may have substantially the same shape as each of the third pixel electrode 221c and the third emission layer 223c.

Each of the first sub-pixel Pa1, the second sub-pixel Pa2, and the third sub-pixel Pa3 may be arranged or disposed long in the y direction. A length of the second sub-pixel Pa2 in the y direction may be greater than lengths of the first sub-pixel Pa1 and the third sub-pixel Pa3 in the y direction. Each of the first sub-pixel Pa1 and the third sub-pixel Pa3 may include a long portion in the y direction and a portion protruding in the x direction from the long portion thereof.

Each of the first pixel electrode 221a and the first emission layer 223a of the first sub-pixel Pa1 may include a long portion in the y direction and a protruding portion in the –x direction. The long portion of each of the first pixel electrode 221a and the first emission layer 223a of the first sub-pixel Pa1 may overlap a first pixel circuit PC1, and the protruding portion thereof may overlap a first line group HL extending around a circuit area CA'. A long portion of the first sub-pixel Pa2 in the y direction may overlap a second pixel circuit PC2 and a second line group VL extending around the circuit area CA'. Each of the third pixel electrode 221c and the third emission layer 223c of the third sub-pixel Pa3 may include a long portion in the y direction and a protruding portion in the +x direction. The long portion of each of the third pixel electrode 221c and the third emission layer 223c of the third sub-pixel Pa3 may overlap a third pixel circuit PC3, and the protruding portion thereof may overlap the first line group HL extending around the circuit area CA'.

A first via hole VIA1 may overlap the first pixel electrode 221a of the first sub-pixel Pa1 without overlapping the first emission layer 223a. The first via hole VIA1 may be spaced apart or offset from the first emission layer 223a. The first via hole VIA1 may overlap the pixel defining layer (refer to 119 in FIG. 8). A second via hole VIA2 may overlap the second pixel electrode 221b and the second emission layer 223b of the second sub-pixel Pa2. A third via hole VIA3 may overlap the third pixel electrode 221c and the third emission layer 223c of the third sub-pixel Pa3.

Each of a lower electrode layer BSM and an opposite electrode 225 may include an opening corresponding to the transmissive area TA and may have a lattice shape. The lower electrode layer BSM and the opposite electrode 225 may have areas corresponding to the non-transmissive area CA and may overlap the first line group HL, the second line group VL, and the second pixel PA.

Figure 19:
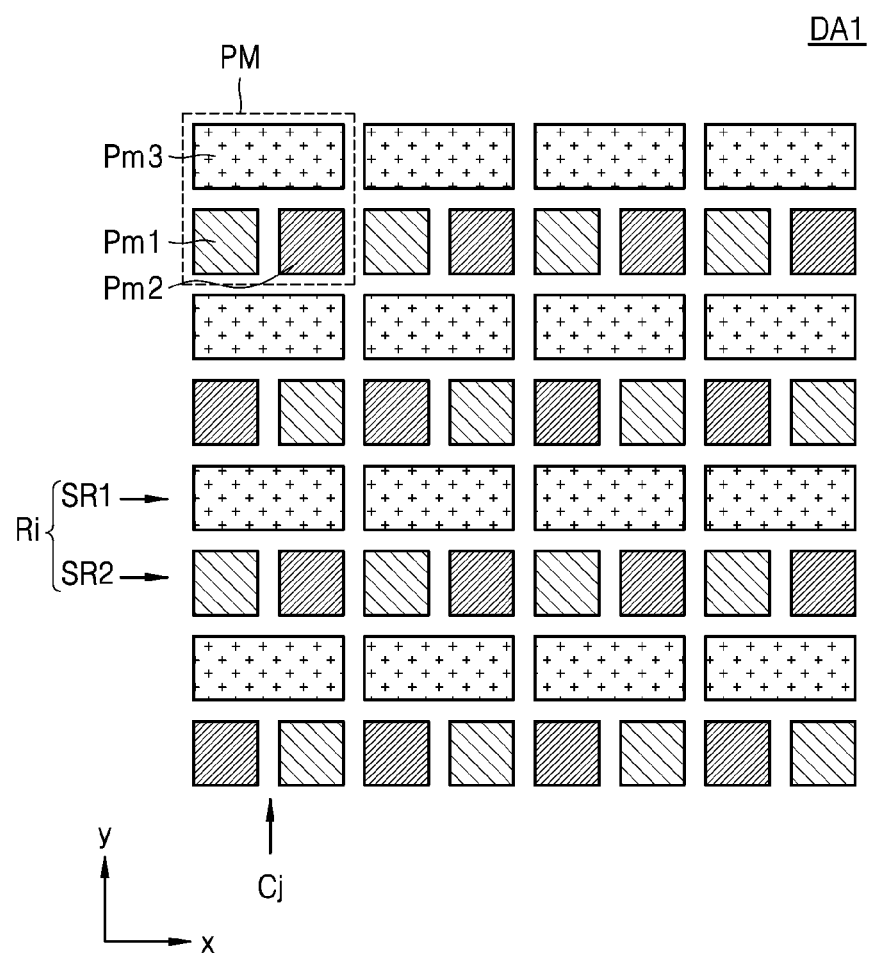
FIG. 19 is a schematic plan view showing the arrangements of pixels in a first display area according to an embodiment.
Figure 20A:
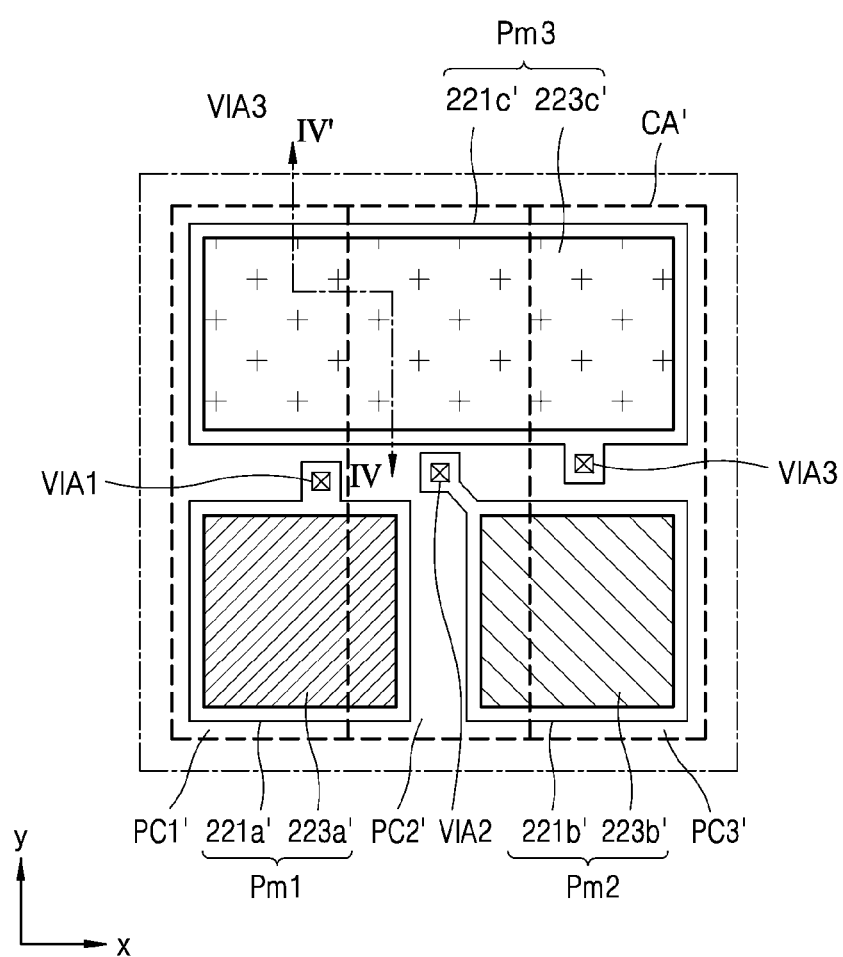
FIG. 20A is an enlarged view of a first pixel of FIG. 19.
Figure 20B:
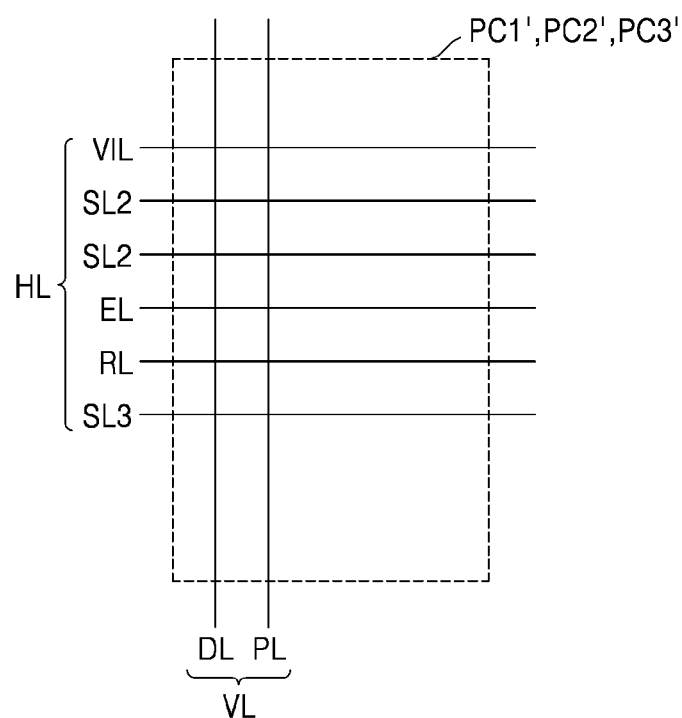
FIG. 20B is a schematic diagram of a first line group and a second line group.
Figure 21:
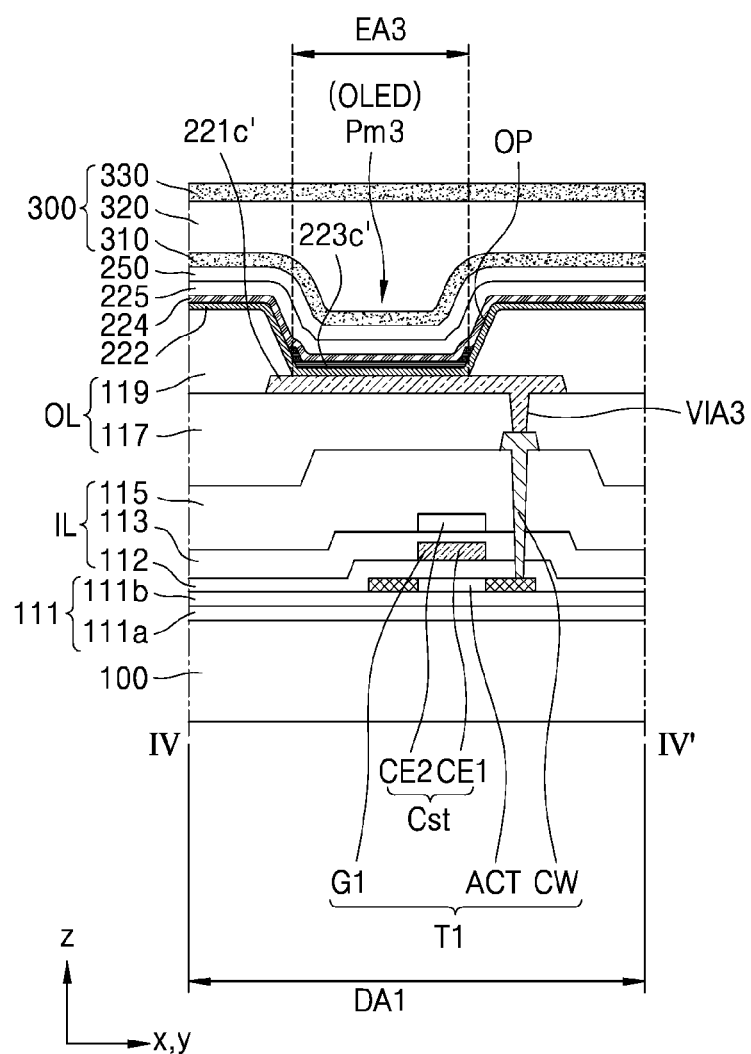
FIG. 21 is a schematic cross-sectional view of the first pixel, which is taken along a line IV-IV' of FIG. 20A.

FIG. 19 is a schematic plan view showing the arrangements of pixels in a first display area DA1 according to an embodiment. FIG. 20A is an enlarged view of a first pixel PM of FIG. 19. FIG. 20B is a schematic diagram of a first line group HL and a second line group VL. FIG. 21 is a schematic cross-sectional view of the first pixel PM, which is taken along a line IV-IV' of FIG. 20A.

Referring to FIG. 19, first pixels PM may be repetitively arranged or disposed in an ±x direction (row direction) and a ±y direction (column direction) in the first display area DA1 of a display device. The first pixel PM may include sub-pixels. The first pixel PM may include a first sub-pixel Pm1, a second sub-pixel Pm2, and a third sub-pixel Pm3.

The third sub-pixel Pm3 may be arranged or disposed in the x direction in a first sub-row SR1 of each row Ri, and the first sub-pixel Pm1 and the second sub-pixel Pm2 may be alternately arranged or disposed in the x direction in a second sub-row SR2 of each row Ri. One third sub-pixel Pm3 may be provided or disposed to correspond to one first sub-pixel Pm1 and one second sub-pixel Pm2. Thus, a size of the third sub-pixel Pm3 may be greater than sizes of the first sub-pixel Pm1 and the second sub-pixel Pm2. A length of the third sub-pixel Pm3 in the x direction may be equal to or greater than the sum of a length of the first sub-pixel Pm1 in the x direction and a length of the second sub-pixel Pm2 in the x direction.

As shown in FIG. 20A, a pixel circuit of the first pixel PA may include a first pixel circuit PC1', a second pixel circuit PC2', and a third pixel circuit PC3'. The first pixel circuit PC1', the second pixel circuit PC2', and the third pixel circuit PC3' may be arranged or disposed adjacent to each other in the x direction.

The first sub-pixel Pm1 may include a first pixel electrode 221a' and a first emission layer 223a'. The second sub-pixel Pm2 may include a second pixel electrode 221b' and a second emission layer 223b'. The third sub-pixel Pm3 may include a third pixel electrode 221c' and a third emission layer 223c'. An opposite electrode (refer to 225 in FIG. 21) may be integrally formed or disposed in the first to third sub-pixels Pm1, Pm2, and Pm3 and located or disposed opposite the first to third pixel electrodes 221a', 221b', and 221c' over the first to third emission layers 223a', 223b', and 223c'.

In the first display area DA1, the first line group HL may be arranged or disposed in each row Ri, and the second line group VL may be arranged or disposed in each column Ci. Each of the first to third pixel circuits PC1', PC2', and PC3' may be electrically connected to first lines of the first line group HL and second lines of the second line group VL. As shown in FIG. 20B, the first lines arranged or disposed in each of the first to third pixel circuits PC1', PC2', and PC3' may include an initialization voltage line VIL, a first scan line SL1, a second scan line SL2, a third scan line SL3, an emission control line EL, and a repair line RL, which may extend in the x direction. The second lines arranged or disposed in each of the first to third pixel circuits PC1', PC2', and PC3' may include a data line DL and a power supply voltage line PL, which may extend in the y direction. The first to third sub-pixels Pm1, Pm2, and Pm3 may overlap at least one of the first to third pixel circuits PC1', PC2', and PC3' and the first line group HL and the second line group VL.

In the first display area DA1, the first line group HL may include six first lines in each row, and the second line group VL may include six second lines in each column.

Meanwhile, as shown in FIG. 6, in the second display area DA2, a first line group HL may include five first lines in each row, and a second line group VL may include five second lines in each column. Thus, the number of first line groups HL and the number of second line groups VL in the second display area DA2 may be less than the number of first line groups HL and second line groups VL in the first display area DA1. A distance between lines of the first line group HL and the second line group VL in the second display area DA2 may be less than a distance between lines of the first line group HL and the second line group VL in the first display area DA1. For example, although a pixel circuit provided or disposed in the second display area DA2 may be the same as a pixel circuit provided or disposed in the first display area DA1, a transmissive area TA may be increased or maximized in the second display area DA2 without loss of resolution by adjusting the number of lines and a distance between the lines.

Figure 22:
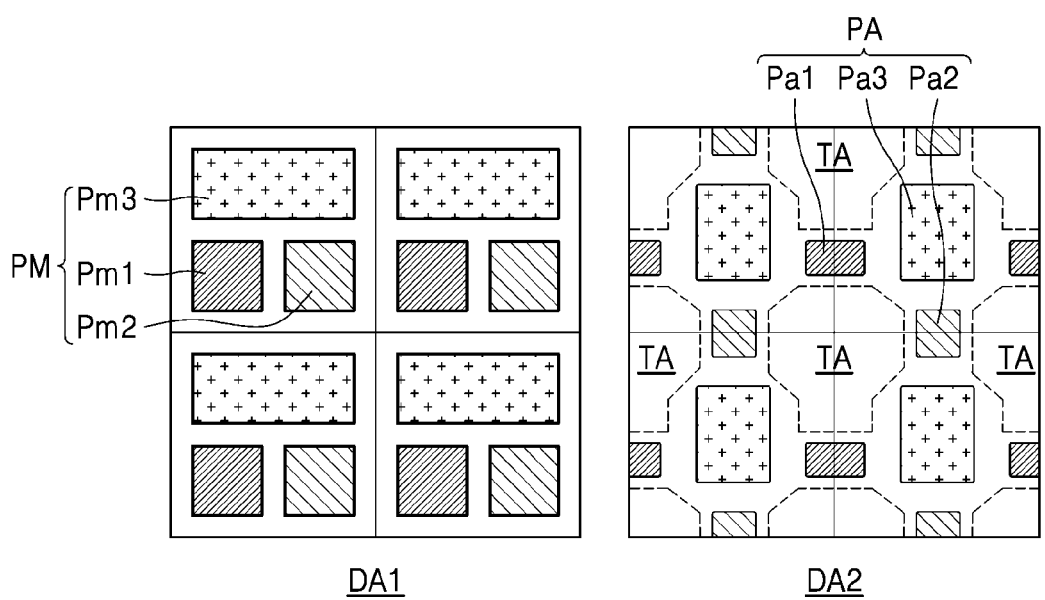
FIGS. 22 to 25 are diagrams showing the arrangement of first pixels in a first display area and the arrangement of second pixels in a second display area.
Figure 23:
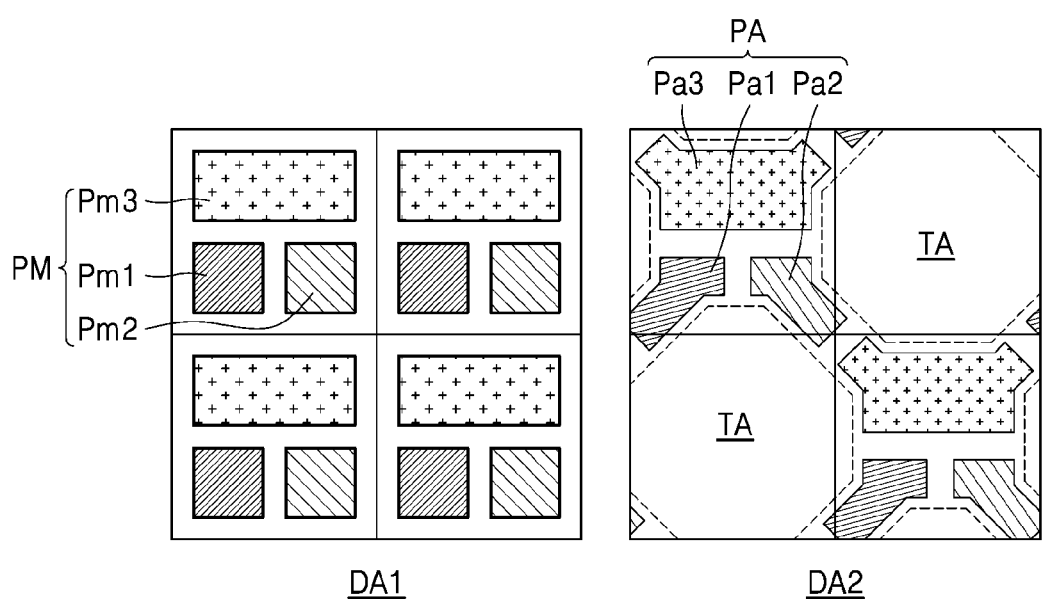
Figure 24:
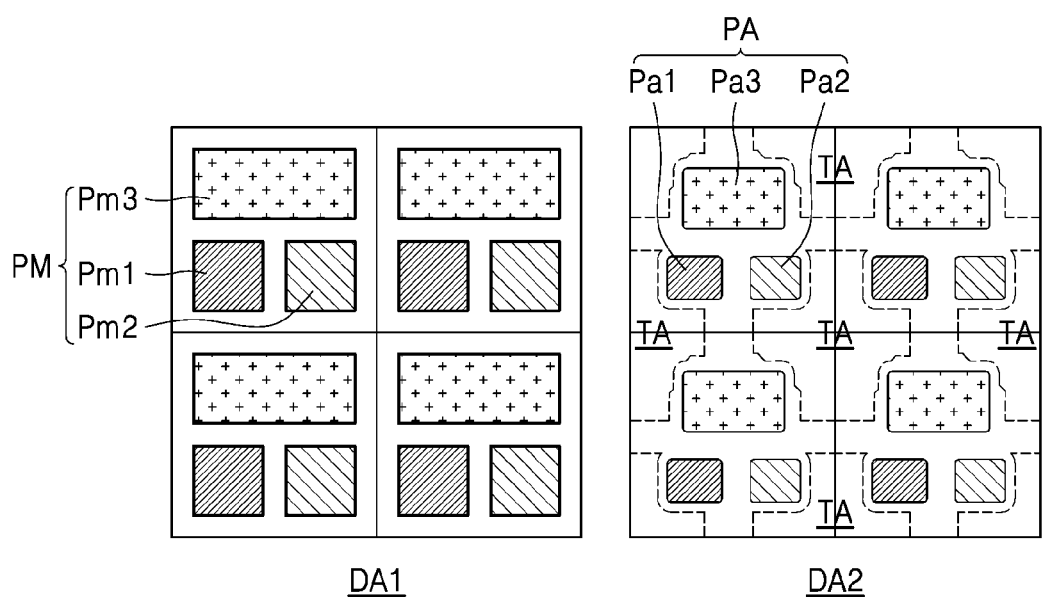
Figure 25:
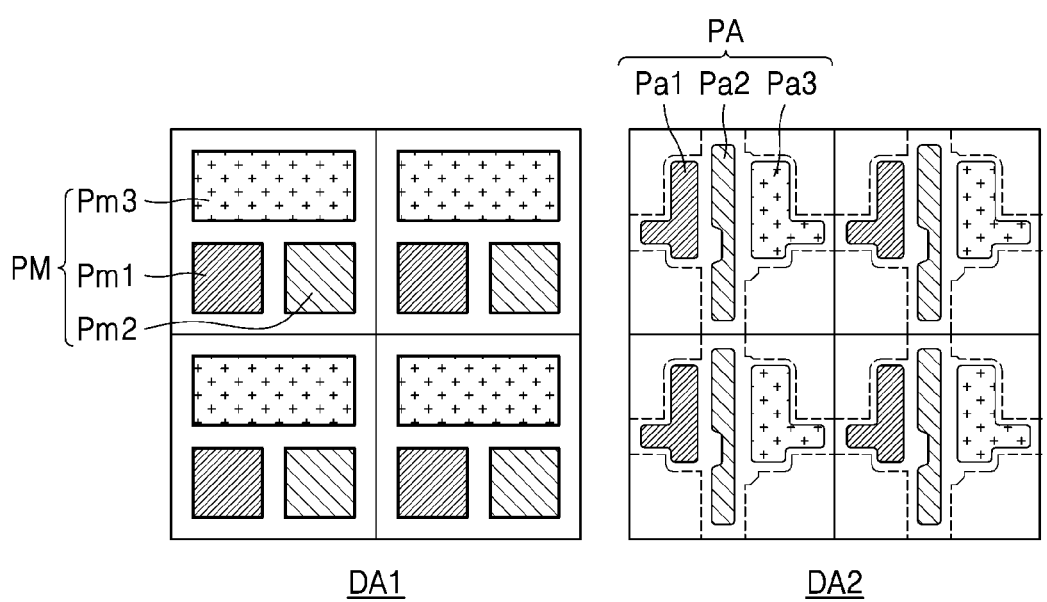

FIGS. 22 to 25 are diagrams showing the arrangement of first pixels in a first display area and the arrangement of second pixels in a second display area. The first pixel PM shown in FIG. 19 and the second pixel PA shown in FIG. 5A are illustrated in FIG. 22. The first pixel PM shown in FIG. 19 and the second pixel PA shown in FIG. 11A are illustrated in FIG. 23. The first pixel PM shown in FIG. 19 and the second pixel PA shown in FIG. 15 are illustrated in FIG. 24. The first pixel PM shown in FIG. 19 and the second pixel PA shown in FIG. 17 are illustrated in FIG. 25.

A first pixel PM including first to third sub-pixels Pm1, Pm2, and Pm3 may be arranged or disposed in a first display area DA1, and a second pixel PA including first to third sub-pixels Pa1, Pa2, and Pa3 may be arranged or disposed in a second display area DA2. The first to third sub-pixels Pm1, Pm2, and Pm3 may render red, green, and blue, respectively. The first to third sub-pixels Pa1, Pa2, and Pa3 may render red, green, and blue, respectively.

In an embodiment, the arrangement of the first to third sub-pixels Pa1, Pa2, and Pa3 in the second display area DA2 may be different from the arrangement of the first to third sub-pixels Pm1, Pm2, and Pm3 in the first display area DA1. In an embodiment, the arrangement of the first to third sub-pixels Pa1, Pa2, and Pa3 in the second display area DA2 may be the same as or similar to the arrangement of the first to third sub-pixels Pm1, Pm2, and Pm3 in the first display area DA1.

Distances among the first to third sub-pixels Pa1, Pa2, and Pa3 in the second display area DA2 may be less than distances among the first to third sub-pixels Pm1, Pm2, and Pm3 in the first display area DA1.

The number of lines, which may be electrically connected to the first to third sub-pixels Pa1, Pa2, and Pa3 in the second display area DA2 and may extend around a pixel circuit (for example, up, down, left, and right directions and diagonal directions of the pixel circuit), may be less than the number of lines electrically connected to the first to third sub-pixels Pm1, Pm2, and Pm3 in the first display area DA1.

As shown in FIGS. 22, 24, and 25, a size (or area) of each of the first to third sub-pixels Pa1, Pa2, and Pa3 in the second display area DA2 may be less than a size (or area) of each of the first to third sub-pixels Pm1, Pm2, and Pm3 corresponding thereto in the first display area DA1. As shown in FIG. 23, the size (or area) of each of the first to third sub-pixels Pa1, Pa2, and Pa3 in the second display area DA2 may be greater than or equal to the size (or area) of each of the first to third sub-pixels Pm1, Pm2, and Pm3 corresponding thereto in the first display area DA1.

The second display area DA2 shown in FIG. 23 may have a lower resolution or a larger transmissive area TA than the first display area DA1. The arrangement of sub-pixels in the second display area DA2 shown in FIG. 24 may be similar to the arrangement of sub-pixels in the first display area DA1, and thus, a difference between an image of the first display area DA1 and an image of the second display area DA2 may be minimized.

In embodiments, a circuit area and a line region of the second pixel PA may be reduced, and the first to third sub-pixels Pa1, Pa2, and Pa3 may be arranged or disposed to overlap the circuit area and/or lines, and thus, the transmissive area TA may be increased or maximized in the second display area DA2.

In embodiments, the arrangement and number of lines arranged or disposed in a second display area may be different from the arrangement and number of lines arranged or disposed in a first display area, and thus, a transmissive area may be increased or maximized and a lifespan of a panel may be increased. Accordingly, a highly reliable display device may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a first line group comprising first lines extending in a first direction on a substrate, in a plan view;
   a second line group comprising second lines extending in a second direction on the substrate, the second direction intersecting the first direction in a plan view;
   a pixel circuit disposed at a region where the first line group intersects the second line group;
   a display element overlapping the pixel circuit;
   a transmissive area surrounded by the first line group and the second line group and not overlapping the first line group or the second line group, in a plan view; and
   a metal layer disposed between the substrate and the pixel circuit in a cross-sectional view, the metal layer comprising an opening corresponding to the transmissive area,
   wherein the metal layer overlaps the first line group. the second line group, and the pixel circuit.

2. The display device of claim 1, wherein the display element comprises:
   a first sub-pixel overlapping the first line group around the pixel circuit;

a second sub-pixel overlapping the second line group around the pixel circuit; and
a third sub-pixel overlapping the pixel circuit.

3. The display device of claim 2, wherein
the first sub-pixel and the third sub-pixel are disposed adjacent to each other in a same row, and
the second sub-pixel and the first sub-pixel are disposed adjacent to each other in different rows.

4. The display device of claim 2, wherein a size of an emission area of the third sub-pixel is greater than sizes of emission areas of the first sub-pixel and the second sub-pixel.

5. The display device of claim 1, wherein
portions of the first lines and the second lines are bent and extend in a third direction between the first direction and the second direction around the pixel circuit,
other portions of the first lines and the second lines are bent and extend in a fourth direction around the pixel circuit, wherein the fourth direction is line symmetrical to the third direction,
wherein the display element comprises:
a first sub-pixel overlapping the portions of the first lines and the second lines, which extend in the third direction around the pixel circuit;
a second sub-pixel overlapping the other portions of the first lines and the second lines, which extend in the fourth direction around the pixel circuit; and
a third sub-pixel overlapping the pixel circuit.

6. The display device of claim 5, wherein
the first sub-pixel and the second sub-pixel are disposed adjacent to each other in a same row, and
the third sub-pixel and the first sub-pixel are disposed adjacent to each other in different rows.

7. The display device of claim 5, wherein a size of an emission area of the third sub-pixel is greater than sizes of emission areas of the first sub-pixel and the second sub-pixel.

8. The display device of claim 1, wherein the display element comprises:
a first sub-pixel overlapping the first line group and portions of the second line group around the pixel circuit;
a second sub-pixel overlapping the first line group and others of the second line group around the pixel circuit; and
a third sub-pixel overlapping the pixel circuit.

9. The display device of claim 8, wherein
the first sub-pixel and the second sub-pixel are disposed adjacent to each other in a same row, and
the third sub-pixel and the first sub-pixel are disposed adjacent to each other in different rows.

10. The display device of claim 8, wherein a size of an emission area of the third sub-pixel is greater than sizes of emission areas of the first sub-pixel and the second sub-pixel.

11. The display device of claim 1, wherein
the display element comprises first to third sub-pixels overlapping the pixel circuit and disposed adjacent to each other in the first direction, and
the first sub-pixel and the third sub-pixel partially overlap the first line group around the pixel circuit.

12. The display device of claim 11, wherein a size of an emission area of the third sub-pixel in the second direction is greater than sizes of emission areas of the first sub-pixel and the second sub-pixel in the second direction.

13. The display device of claim 1, wherein
the display element comprises a plurality of sub-pixels, each of the plurality of sub-pixels comprises a pixel electrode and an emission layer, and
an opposite electrode is disposed in each of the plurality of sub-pixels and disposed on the emission layer, the opposite electrode comprising an opening corresponding to the transmissive area.

14. The display device of claim 13, further comprising:
a planarization layer disposed between the pixel circuit and the plurality of sub-pixels; and
a pixel defining layer disposed between the pixel electrode and the opposite electrode, wherein
the planarization layer comprises holes overlapping the pixel electrodes of the plurality of sub-pixels, and the pixel defining layer overlaps the holes of the planarization layer.

15. The display device of claim 13, further comprising:
a planarization layer disposed between the pixel circuit and the plurality of sub-pixels, the planarization layer including holes overlapping the pixel electrodes of the plurality of sub-pixels; and
a pixel defining layer disposed between the pixel electrode and the opposite electrode,
wherein the holes of the planarization layer comprise:
holes that overlap the pixel defining layer; and
holes that overlap the emission layer.

16. The display device of claim 1, further comprising:
an inorganic insulating layer disposed on the substrate,
wherein the inorganic insulating layer comprises an opening corresponding to the transmissive area.

17. A display device comprising:
a substrate comprising a first display area and a second display area;
a first line group comprising first lines extending in a first direction in the first display area, in a plan view;
a second line group comprising second lines extending in a second direction in the first display area, the second direction intersecting the first direction, in a plan view;
a first pixel in the first display area, the first pixel comprising a first subpixel, a second subpixel, and a third subpixel, first pixel circuits of the first subpixel, the second subpixel, and the third subpixel disposed at a region where the first line group intersects the second line group in the first display area;
a third line group comprising third lines extending in the first direction in the second display area, in a plan view;
a fourth line group comprising fourth lines extending in the second direction in the second display area, in a plan view; and
a second pixel in the second display area, the second pixel comprising a fourth subpixel, a fifth subpixel, and a sixth subpixel, second pixel circuits of the fourth subpixel, the fifth subpixel, and the sixth subpixel disposed at a region where the third line group intersects the fourth line group in the second display area, wherein
the second display area comprises a transmissive area surrounded by the third line group and the fourth line group and not overlapping the first line group or the second line group, in a plan view, and
a number of the third lines and the fourth lines connected to the second pixel circuits at the region where the third line group intersects the fourth line group in the second display area is less than a number of the first lines and the second lines connected to the first pixel circuits at the region where the first line group intersects the second line group in the first display area.

18. The display device of claim 17, further comprising:
a metal layer disposed between the substrate and the second pixel circuit in the second display area, the metal layer comprising an opening corresponding to the transmissive area,
wherein the second pixel circuits overlap the metal layer.

19. The display device of claim 17, further comprising:
first pixel electrodes overlapping the first pixel circuits;
second pixel electrodes overlapping the second pixel circuits;
an opposite electrode disposed in the first display area and the second display area, wherein
the opposite electrode overlaps the first line group, the second line group, the third line group, the fourth line group, the first pixel electrodes, and the second pixel electrodes, and
the opposite electrode comprises an opening corresponding to the transmissive area in the second display area.

20. The display device of claim 17, wherein the third lines of the third line group and the fourth lines of the fourth line group extend in a third direction around the second pixel circuits in the second display area, the third direction being a direction between the first direction and the second direction.

\* \* \* \* \*